United States Patent
Shimoto et al.

(12)

(10) Patent No.: US 6,861,757 B2
(45) Date of Patent: Mar. 1, 2005

(54) INTERCONNECTING SUBSTRATE FOR CARRYING SEMICONDUCTOR DEVICE, METHOD OF PRODUCING THEREOF AND PACKAGE OF SEMICONDUCTOR DEVICE

(75) Inventors: Tadanori Shimoto, Tokyo (JP); Katsumi Kikuchi, Tokyo (JP); Koji Matsui, Tokyo (JP); Kazuhiro Baba, Tokyo (JP)

(73) Assignee: NEC Corporation, Tokyo (JP)

( * ) Notice: Subject to any disclaimer, the term of this patent is extended or adjusted under 35 U.S.C. 154(b) by 82 days.

(21) Appl. No.: 10/097,843

(22) Filed: Mar. 15, 2002

(65) Prior Publication Data

US 2003/0045024 A1 Mar. 6, 2003

(30) Foreign Application Priority Data

Sep. 3, 2001 (JP) ........................................ 2001-265802

(51) Int. Cl.[7] .......................... H01L 23/48; H01L 29/40
(52) U.S. Cl. ...................................................... 257/773
(58) Field of Search .......................... 257/773; 438/108, 438/118

(56) References Cited

U.S. PATENT DOCUMENTS

| | | | | |
|---|---|---|---|---|
| 5,830,563 A | * | 11/1998 | Shimoto et al. | ............ 428/209 |
| 6,156,414 A | * | 12/2000 | Shimoto et al. | ............ 428/209 |
| 6,204,565 B1 | * | 3/2001 | Shimoto et al. | ............ 257/783 |
| 2002/0024138 A1 | * | 2/2002 | Shimoto et al. | ............ 257/753 |

FOREIGN PATENT DOCUMENTS

| | | | |
|---|---|---|---|
| JP | 5-259639 | 10/1993 | |
| JP | 6-260763 | 9/1994 | |
| JP | 7-283539 | 10/1995 | |
| JP | 9-214141 | 8/1997 | |
| JP | 9-307234 | 11/1997 | |
| JP | 10-200015 | 7/1998 | |
| JP | 10-335826 | 12/1998 | |
| JP | 11-067849 | * 3/1999 | ........... H01L/21/60 |
| JP | 11-163022 | 6/1999 | |
| JP | 2000-3037 | 1/2000 | |
| JP | 2000-3980 | 1/2000 | |
| JP | 2000-323613 | 11/2000 | |
| JP | 324384 | 11/2001 | |

* cited by examiner

Primary Examiner—W. David Coleman
(74) Attorney, Agent, or Firm—Young & Thompson

(57) ABSTRACT

An interconnecting substrate for carrying a semiconductor device, comprising: an insulating layer; an interconnection set on an obverse surface of the insulating layer; an electrode which is set on a reverse surface side of the insulating layer and formed in such a way that, at least, a lateral face of an obverse end of the electrode is all round brought into contact with the insulating layer, while, at least, a reverse surface of the electrode is not in contact with said insulating layer; a via conductor which is disposed on an obverse surface of the electrode and formed in the insulating layer so as to connect this electrode with the interconnection; and a supporting structure on the surface of the insulating layer.

46 Claims, 13 Drawing Sheets

(a)

(b)

(a)

(b)

(c)

(d)

(e)

INTERCONNECTING SUBSTRATE FOR CARRYING SEMICONDUCTOR DEVICE, METHOD OF PRODUCING THEREOF AND PACKAGE OF SEMICONDUCTOR DEVICE

TECHNICAL FIELD

The present invention relates to an interconnecting substrate which is capable to carry a semiconductor device of all sorts with a high density and fittingly used to produce a high-speed, high-density module or system, and a method of producing thereof as well as a package of a semiconductor device in which the interconnecting substrate carries a semiconductor device thereon.

BACKGROUND ART

In recent years, accompanying the increase in the number of terminals and the narrowing of their pitches in the semiconductor device which result from advancements in the speed of operations, the capability of multi functions and the degree of integration thereof, there have been, more than ever, growing demands that the interconnecting substrate for packaging which carries the semiconductor device also attains a higher density in arrangement and minuter interconnections.

As the interconnecting substrate for packaging which is currently in wide use, there can be given the build-up multi-layered substrate, a sort of multi-layered interconnecting substrate.

Using a glass epoxy print substrate as the base core substrate, this build-up multi-layered substrate is fabricated in the following way. Firstly, an epoxy resin layer is each formed on both surfaces of this glass epoxy print substrate. Next, via holes are formed in these epoxy resin layers by means of photolithography or laser. After that, with a combination of the electroless or electrolytic Cu plating method and the photolithography, an interconnection layer and via conductors are formed. By repeating the above steps successively, the formation of build-up layered structure is accomplished.

However, because the glass epoxy print substrate whose heat resistance is considerably low is utilized as the base core substrate in this build-up multi-layered substrate, there arises a problem that the heat treatments performed in fabrication of the build-up multi-layered substrate may bring the glass epoxy print substrate to a poor condition, creating defects such as the shrinkage, the warp and the swell. These defects markedly lower the accuracy in the step of exposure so that it is difficult to form a densely spaced minute interconnection pattern on the glass epoxy print substrate.

Further, when the semiconductor device is loaded on such a build-up multi-layered substrate by the flip chip method, heat treatments carried out at the time of chip loading and solder reflow are liable to cause the faulty connection and the distortion, and, therefore, liable to lower the long-term reliability for the connection.

For the purpose of overcoming the above problems, there have been proposed an interconnecting substrate for packaging, wherein a build-up layered structure is formed on a base substrate made of a metal board (Japanese Patent Application Laid-open No.3980/2000).

A series of schematic views illustrating the steps of a producing method of such an interconnecting substrate for packaging are shown in FIG. 18. First, as shown in FIG. 18(a), an insulating layer 102 is formed on a metal board 101 and, then, via holes 103 are formed in this insulating layer 102. Next, as shown in FIG. 18(b), an interconnection pattern 104 is formed on the insulating layer 102 including the via holes 103. Next, as shown in FIG. 18(c), an insulating layer 106 is formed over the interconnection pattern 104, and then, in this insulating layer 106, flip chip pad sections 105 are formed to reach the interconnection pattern 104. Finally, as shown in FIG. 18(d), the metal board 101 is etched from the backside, and a substrate-reinforcing structure 107 as well as external electrode terminals 108 are formed therefrom.

In recent years, for the interconnecting substrate for packaging, it has been strongly demanded, along with attaining the afore-mentioned higher density in arrangement and minuter interconnections, that the external electrodes for making electrical connection with an external board or apparatus have narrower pitches in order to achieve a more compact and more densely spaced system.

Nevertheless, in the interconnecting substrates for packaging shown in FIG. 18, since the external electrode terminals 108 thereof are formed by etching the metal board 101, the limitation of control over the amount of side etching at the time of etching makes it extremely difficult to form the external electrode terminals 108 with narrow pitches.

Moreover, when this interconnecting substrate for packaging is mounted on an external board or apparatus, the stress is structurally centered on the interface between the external electrode terminal 108 and the insulating layer 102, which tends to give rise to opening defects so that the satisfactory mounting reliability cannot be obtained.

DISCLOSURE OF THE INVENTION

In light of the above problems, an object of the present invention is to provide an interconnecting substrate for carrying a semiconductor device, wherein, to match with the increase in number of terminals and the narrowing of their pitches in the semiconductor device, a higher density in arrangement and minuter interconnections are achieved, and besides, to match with a more compact and more densely spaced system, the narrowing of the pitches for the external electrodes is achieved, and, in addition, the excellent mounting reliability is attained, and a method of producing thereof as well as a package of a semiconductor device.

The present invention relates to an interconnecting substrate for carrying a semiconductor device, comprising:

an insulating layer;

an interconnection set on an obverse surface of said insulating layer;

an electrode which is set on a reverse surface side of said insulating layer and formed in such a way that, at least, a lateral face of an obverse end of the electrode is all round brought into contact with said insulating layer, while, at least, a reverse surface of the electrode is not in contact with said insulating layer;

a via conductor which is disposed on an obverse surface of said electrode and formed in said insulating layer so as to connect this electrode with said interconnection; and a supporting structure on the surface of said insulating layer.

Further, the present invention relates to an interconnecting substrate for carrying a semiconductor device as set forth above, wherein the lateral face of said electrode is all round in contact with said insulating layer, and the reverse surface of said electrode is in one and the same plane with the reverse surface of said insulating layer.

Further, the present invention relates to an interconnecting substrate for carrying a semiconductor device as set forth above, wherein said insulating layer has a sunken section on the reverse surface thereof and the reverse surface of said electrode forms a base of said sunken section.

Further, the present invention relates to an interconnecting substrate for carrying a semiconductor device as set forth above, wherein a reverse end section of said electrode is protruding from the reverse surface of said insulating layer.

Further, the present invention relates to an interconnecting substrate for carrying a semiconductor device as set forth above, wherein said electrode has a layered structure in which a Cu layer is disposed in an obverse end section and, at least, one layer of another conductive substance is disposed on a reverse end side thereof.

Further, the present invention relates to an interconnecting substrate for carrying a semiconductor device as set forth above, which has a multi-layered interconnection structure in which, on the obverse surface of said insulating layer where said interconnection is formed, another insulating layer and another interconnection formed on an obverse surface of this insulating layer are laid one after another in alternate order to form one or more sets thereof.

Further, the present invention relates to an interconnecting substrate for carrying a semiconductor device as set forth above, further comprising a capacitor composed of:

an electrode which is set on a reverse surface side of said insulating layer and formed in such a way that, at least, a lateral face of an obverse end of the electrode is all round brought into contact with said insulating layer, while, at least, a reverse surface of the electrode is not in contact with said insulating layer;

a dielectric substance layer laid on an obverse surface of said electrode; and a conductive substance layer which is laid on an obverse surface of said dielectric substance layer and connected with said interconnection set on the obverse surface of said insulating layer.

Further, the present invention relates to an interconnecting substrate for carrying a semiconductor device as set forth above, wherein said supporting structure is set on the reverse surface of said insulating layer so as to allow the reverse surface of said electrode to be exposed.

Further, the present invention relates to an interconnecting substrate for carrying a semiconductor device as set forth above, wherein said supporting structure is set on the entire reverse surface of said insulating layer.

Further, the present invention relates to an interconnecting substrate for carrying a semiconductor device, comprising an interconnecting substrate as set forth above each set on an obverse surface side and a reverse surface side of a layered board wherein two substrates are bonded together, said substrates each serving as said supporting structure.

Further, the present invention relates to a package of a semiconductor device, wherein an interconnecting substrate as set forth above carries a semiconductor device.

Further, the present invention relates to a package of a semiconductor device comprising:

an interconnecting substrate, and a semiconductor device carried on said interconnecting substrate, wherein said interconnecting substrate comprising:

an insulating layer;

an interconnection set on an obverse surface of said insulating layer;

an electrode which is set on a reverse surface side of said insulating layer and formed in such a way that, at least, a lateral face of an obverse end of the electrode is all round brought into contact with said insulating layer, while, at least, a reverse surface of the electrode is not in contact with said insulating layer; and a via conductor which is disposed on an obverse surface of said electrode and formed in said insulating layer so as to connect this electrode with said interconnection.

Further, the present invention relates to a package of a semiconductor device as set forth above, wherein the lateral face of said electrode is all round in contact with said insulating layer, and the reverse surface of said electrode is in one and the same plane with the reverse surface of said insulating layer.

Further, the present invention relates to a package of a semiconductor device as set forth above, wherein said insulating layer has a sunken section on the reverse surface thereof and the reverse surface of said electrode forms a base of said sunken section.

Further, the present invention relates to a package of a semiconductor device as set forth above, wherein a reverse end section of said electrode is protruding from the reverse surface of said insulating layer.

Further, the present invention relates to a package of a semiconductor device as set forth above, wherein said electrode has a layered structure in which a Cu layer is disposed in an obverse end section and, at least, one layer of another conductive substance is disposed on a reverse end side thereof.

Further, the present invention relates to a package of a semiconductor device as set forth above, which has a multi-layered interconnection structure in which, on the obverse surface of said insulating layer where said interconnection is formed, another insulating layer and another interconnection formed on an obverse surface of this insulating layer are laid one after another in alternate order to form one or more sets thereof.

Further, the present invention relates to a package of a semiconductor device as set forth above further comprising a capacitor composed of:

an electrode which is set on a reverse surface side of said insulating layer and formed in such a way that, at least, a lateral face of an obverse end of the electrode is all round brought into contact with said insulating layer, while, at least, a reverse surface of the electrode is not in contact with said insulating layer;

a dielectric substance layer laid on an obverse surface of said electrode; and a conductive substance layer which is laid on an obverse surface of said dielectric substance layer and connected with said interconnection set on the obverse surface of said insulating layer.

Further, the present invention relates to a method of producing an interconnecting substrate for carrying a semiconductor device, comprising:

forming an electrode pattern on a substrate;

forming, on said substrate, an insulating layer so as to cover said electrode pattern;

forming, in said insulating layer, a via hole to reach said electrode pattern; and forming, on said insulating layer, a conductive substance layer so as to fill up said via hole, and then forming an interconnection pattern by patterning said conductive substance layer.

Further, the present invention relates to a method of producing an interconnecting substrate for carrying a semiconductor device as set forth above, further comprising the step of forming a dielectric substance layer on a prescribed section of said electrode pattern, after forming said pattern, wherein said dielectric substance layer, said electrode pattern lying under the dielectric substance layer and said conductive substance layer filling up the via hole made down to said dielectric substance layer constitute a capacitor.

Further, the present invention relates to a method of producing an interconnecting substrate for carrying a semiconductor device as set forth above, further comprising the step of removing said substrate selectively and thereby, along with exposing said electrode pattern, making a supporting structure of the remaining part of said substrate.

Further, the present invention relates to a method of producing an interconnecting substrate for carrying a semiconductor device as set forth above, further comprising the step of removing said substrate to expose said electrode pattern, after loading a semiconductor device thereon.

Further, the present invention relates to a method of producing an interconnecting substrate for carrying a semiconductor device as set forth above, further comprising the step of removing a portion of said exposed electrode pattern by selective etching, as thick as prescribed, and thereby a sunken section is formed on a reverse surface of said insulating layer.

Further, the present invention relates to a method of producing an interconnecting substrate for carrying a semiconductor device as set forth above, wherein, in the step of forming an electrode pattern on said substrate, with a conductive substrate being used as said substrate, a resist layer which has an opening pattern corresponding to the electrode pattern is formed on said substrate, and a deposition of metal is made inside of said opening pattern by the plating method, whereby said electrode pattern is formed.

Further, the present invention relates to a method of producing an interconnecting substrate for carrying a semiconductor device as set forth above, wherein etching of said substrate is carried out, using said resist layer as a mask, and thereby a sunken section corresponding to said opening pattern of the resist layer is formed on an obverse surface of said substrate, and thereafter said electrode pattern is formed through a deposition of metal made on this sunken section.

Further, the present invention relates to a method of producing an interconnecting substrate for carrying a semiconductor device, comprising:

preparing a layered board wherein a first substrate and a second substrate are bonded together;

forming a first electrode pattern on said first substrate, and forming a second electrode pattern on said second substrate;

forming a first and a second insulting layer on said layered board so as to cover said first and said second electrode pattern, respectively;

forming, in said first insulating layer, a via hole to reach said first electrode pattern and forming, in said second insulating layer, a via hole to reach said second electrode pattern; and forming respective conductive substance layers on said first and said second insulating layer so as to fill up said via holes, and forming a first and a second interconnection pattern by patterning said respective conductive substance layers.

Further, the present invention relates to a method of producing an interconnecting substrate for carrying a semiconductor device as set forth above, further comprising the step of separating said first substrate and said second substrate.

Further, the present invention relates to a method of producing an interconnecting substrate for carrying a semiconductor device as set forth above, further comprising the step of applying selective removing onto each of said first and said second substrates, after separating said first and said second substrates, and thereby, along with exposing said electrode patterns, making supporting structures of the remaining parts of said substrates.

Further, the present invention relates to a method of producing an interconnecting substrate for carrying a semiconductor device as set forth above, further comprising the step of removing each of said first and said second substrates to expose said electrode patterns, after loading a semiconductor device thereon.

Further, the present invention relates to a method of producing an interconnecting substrate for carrying a semiconductor device as set forth above, further comprising the step of removing respective portions of said exposed electrode patterns by selective etching, as thick as prescribed, and thereby respective sunken sections are formed on reverse surfaces of said insulating layers.

Further, the present invention relates to a method of producing an interconnecting substrate for carrying a semiconductor device as set forth above, wherein, in the step of forming said first and said second electrode patterns, with conductive substrates being used as said first and said second substrates, resist layers which have opening patterns corresponding to the first and the second electrode patterns are formed on said first and said second substrates, respectively, and a deposition of metal is made inside of said opening patterns by the plating method, whereby said first and said second electrode patterns are formed.

Further, the present invention relates to a method of producing an interconnecting substrate for carrying a semiconductor device as set forth above, wherein etching of said first and said second substrates is carried out, using said respective resist layers as masks, and thereby sunken sections corresponding to said opening patterns of the resist layers are formed on obverse surfaces of said substrates, respectively, and thereafter said first and said second electrode patterns are formed through a deposition of metal made on these sunken sections.

Further, the present invention relates to a method of producing an interconnecting substrate for carrying a semiconductor device as set forth above, wherein, in formation of said electrode pattern, there is formed a layered structure of said electrode pattern in which a Cu layer is disposed in an obverse end section and, at least, one layer of another conductive substance is disposed on a reverse end side thereof.

Further, the present invention relates to a method of producing an interconnecting substrate for carrying a semiconductor device as set forth above, wherein, in formation of said electrode pattern, there is formed a layered structure of said electrode pattern in which a Cu layer is disposed in an obverse end section, a barrier conductive layer to prevent diffusion of solder is disposed on a reverse end side thereof, and a barrier conductive layer to etching removal of said substrate is disposed on a further reverse end side thereof.

The present invention can achieve a higher density in arrangement and minuter interconnections in the interconnecting substrate to match with the increase in number of terminals and the narrowing of their pitches in the semiconductor device, and besides can achieve the narrowing of the pitches for the external electrodes in the interconnecting substrate to match with a more compact and more densely spaced system. Further, the present invention can provide the interconnecting substrate with excellent mounting reliability and can achieve the package of a semiconductor device with high performance capability and excellent reliability.

BEST MODE FOR CARRYING OUT THE INVENTION

The preferred embodiments of an interconnecting substrate for carrying a semiconductor device (referred to, appropriately, as an "interconnecting substrate", hereinafter) and a package of a semiconductor device as well as producing methods of these according to the present invention are each described in detail below.

[Interconnecting Substrate]

Figure 1:
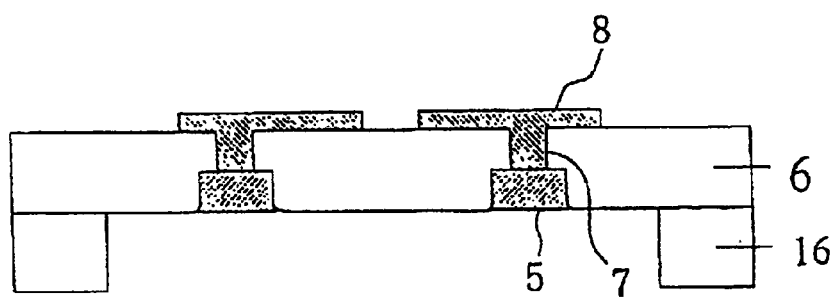
FIG. 1 is a schematic cross-sectional view showing one embodiment of an interconnecting substrate for carrying a semiconductor device according to the present invention.

FIG. 1 is a schematic cross-sectional view showing one embodiment of an interconnecting substrate according to the present invention.

An interconnecting substrate of the present embodiment has an insulating layer 6, an interconnection 8 laid on the obverse surface of this insulating layer 6, electrodes 5 set on the reverse surface side of this insulating layer 6, via conductors 7 each of which is disposed on the obverse surface of one of these electrodes 5 and set within the insulating layer 6 so as to connect this electrode 5 with the interconnection 8, and a supporting structure 16 set on the reverse surface of the insulating layer 6.

For every electrode 5 in the present embodiment, the whole lateral face is all round brought into contact with the insulating layer 6 and the reverse surface of every electrode 5 lies in one and the same plane with the reverse surface of the insulating layer 6. In other words, every electrode 5 is buried in the insulating layer 6 in such a way that only its reverse surface may be exposed from the insulating layer 6. In the present invention, because the electrodes 5 are buried in the insulating layer like this, the stress and the strain imposed on the electrodes 5 are modified and the stress centralization can be reduced so that an interconnecting substrate having excellent mounting reliability on the external board or apparatus can be obtained.

Figure 2:
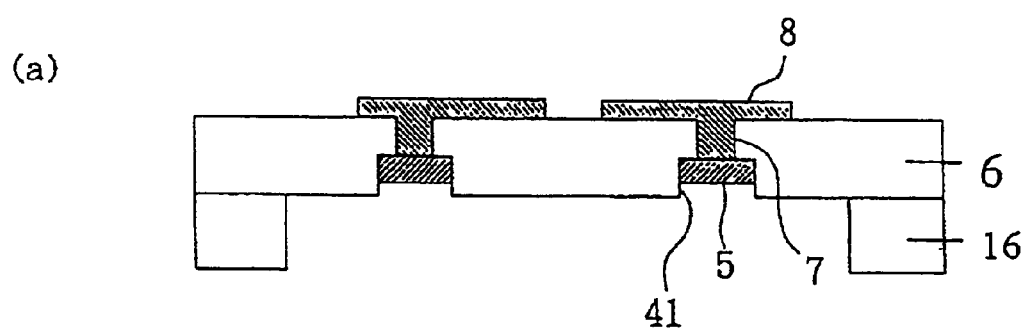
FIG. 2 is schematic cross-sectional views showing other embodiments of an interconnecting substrate for carrying a semiconductor device according to the present invention.
Figure 2:
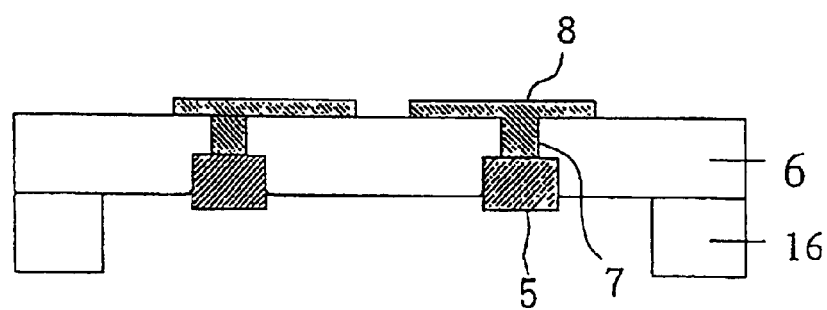

Further, in the interconnecting substrate of the present invention, it is sufficient if the electrode is set on the reverse surface side of the insulating layer in such a way that, at least, the lateral face of its obverse end is all round in contact with the insulating layer, while, at least, its reverse surface thereof is not in contact with the insulating layer, and, thus, in addition to the structure shown in FIG. 1, the structures shown in FIGS. 2(*a*) and (*b*) can be taken.

In the structure shown in FIG. 2(*a*), the insulating layer 6 has sunken sections 41 on the reverse surface side thereof, and the electrodes 5 are disposed within the insulating layer 6 so that the reverse surfaces of the electrodes may each form the base of the sunken section. Through the use of this structure, the stress and the strain imposed on the electrodes 5 are modified and the stress centralization can be reduced and, as a result, it becomes possible not only to obtain an interconnecting substrate having excellent reliability for mounting on the external board or apparatus but also to set solder balls readily on respective electrodes 5 even if electrodes 5 are disposed with narrow pitches.

In the structure shown in FIG. 2(*b*), the reverse ends of the electrodes 5 are protruding from the reverse surface of the insulating layer 6. In this structure, the stress and the strain imposed on the electrodes 5 are modified and the stress centralization can be reduced and, as a result, it becomes possible not only to obtain an interconnecting substrate having excellent reliability for mounting on the external board or apparatus but also to improve the reliability for connecting between the solder balls and the electrodes.

Figure 3:
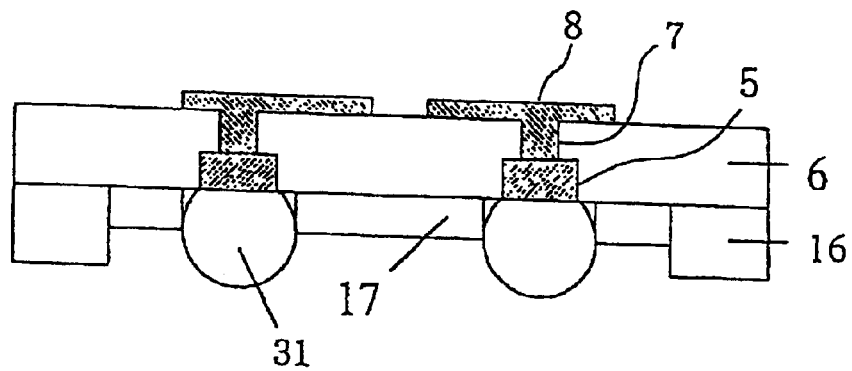
FIG. 3 is a schematic cross-sectional view showing another embodiment of an interconnecting substrate for carrying a semiconductor device according to the present invention.

FIG. 3 is a schematic cross-sectional view showing a structure which has the same arrangement as the one shown in FIG. 1 except that a solder ball 31 is set on every electrode 5. If circumstances require, a solder resist 17 may be set around the electrodes 5. This solder resist 17 may be set also in the structures shown in FIGS. 2(a) and (b), similarly. The solder resist can be formed from any ordinal resist material. By applying such a solder resist thereon, the solder balls can be prevented from rolling when they are set, which makes their setting easier, and besides, once they are installed, the stress centralization on the contact sections between the solder balls and the electrodes 5 may be reduced, which raises the setting stability.

The electrodes disposed on the reverse surface side of the insulating layer in the interconnecting substrate of the present invention can be formed from any of various conductive materials including metals such as Cu, Ag, Au, Ni and the like and alloys thereof, and they can have, in addition to a single-layered structure, a layered structure comprising a solder-diffusion resisting layer and a reinforcement layer for the mechanical strength of the electrode. Examples of an electrode with a layered structure include an electrode (Au/Ni/Cu electrode) in which layers of Au, Ni and Cu are laid in this order from the reverse end side, an electrode (Ni/Au/Ni/Cu electrode) in which layers of Ni, Au, Ni and Cu are laid in this order from the reverse end side, a Au/Ni/Cu electrode to which this Ni/Au/Ni/Cu electrode comes with its lowermost layer of a Ni layer being removed therefrom, and an electrode (Cu/Ag/Cu electrode) in which layers of Cu, Ag and Cu are laid in this order from the reverse end side. In the above electrodes, the intermediate Ni layer serves as the solder-diffusion resisting layer. Further, in the Cu/Ag/Cu electrode, the Ag layer functions as the reinforcement layer to raise the mechanical strength of the electrode.

In the interconnecting substrate of the present invention, the supporting structure set on the surface of the insulating layer is provided to reinforce the interconnecting substrate. By setting the supporting structure in the interconnecting substrate, deformation of the interconnecting substrate such as the warp can be well suppressed and, therefore, excellent reliability for loading the semiconductor chip (device) on the interconnecting substrate and good reliability for mounting the interconnecting substrate or the package of the semiconductor device on the external board or such can be attained.

Figure 4:
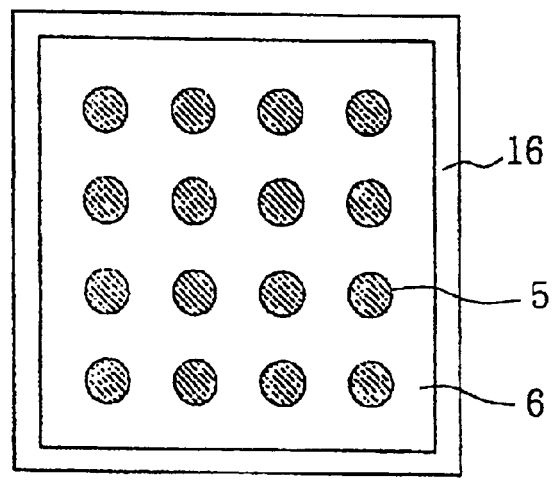
FIG. 4 is a schematic bottom (reverse surface) view showing one embodiment of an interconnecting substrate for carrying a semiconductor device according to the present invention.

In the embodiment shown in FIG. 1, the supporting structure 16 is set on the reverse surface of the insulating layer 6 and formed around the insulating layer 6 in the shape of a frame. FIG. 4 is a schematic bottom view (reverse surface view) showing an interconnecting substrate of the present embodiment. In the interconnecting substrate of the present invention, in addition to the shape of a frame as shown in FIG. 4, the supporting structure may take the shape of a grid or a mesh being set in a region other than the electrodes 5 (so as to make the electrodes 5 exposed). Further, in the interconnecting substrate of the present invention, the supporting structure can be set on the obverse surface of the interconnecting substrate as long as it does not hinder the semiconductor device from being carried thereon. Further, in such an instance, if the supporting structure set on the obverse surface can provide a sufficient mechanical strength, the interconnecting substrate may have no supporting structure on the reverse surface thereof.

Further, in order to mount an interconnecting substrate or a package of a semiconductor device in which a semiconductor chip is carried on this interconnecting substrate, the electrodes 5 must be being exposed, but, if the treatment for making the electrodes 5 exposed can be carried out in the later step, the interconnecting substrate may have a structure in which a supporting structure (supporting board) is set on the entire reverse surface of the interconnecting substrate. In this instance, after a semiconductor chip is loaded on the interconnecting substrate and a package of a semiconductor device is formed, the supporting structure can be subjected to the selective removing so as to take the form of a frame or such, which makes the electrodes 5 exposed. Because the supporting structure is formed on the entire reverse surface, the interconnecting substrate can maintain the planarity still more satisfactorily at the time of loading a semiconductor chip, and the reliability for loading the semiconductor chip can be improved. On the other hand, if the fabricated package of a semiconductor device has a sufficient mechanical strength to provide a good mounting reliability onto an external board without any supporting structure, the whole supporting structure set on the reverse surface of the interconnecting substrate may be taken off therefrom in removing the supporting structure to make the electrodes 5 exposed.

The material of the supporting structure is not specifically limited as far as it can provide the interconnecting substrate a sufficient strength as described above and have a heat resistance strong enough to stand heat treatments performed at the time of loading the semiconductor chip onto the interconnecting substrate and mounting the interconnecting substrate or the package of the semiconductor device, but the conductive material is preferably used from the viewpoint of producing the electrodes, via conductors and interconnections. For the conductive material of this sort, metal made of stainless steel, copper, copper alloy, aluminium, nickel or such is preferably employed because of its availability at low cost, easiness to work into shape, and, what is more, sufficient mechanical strength.

Figure 5:
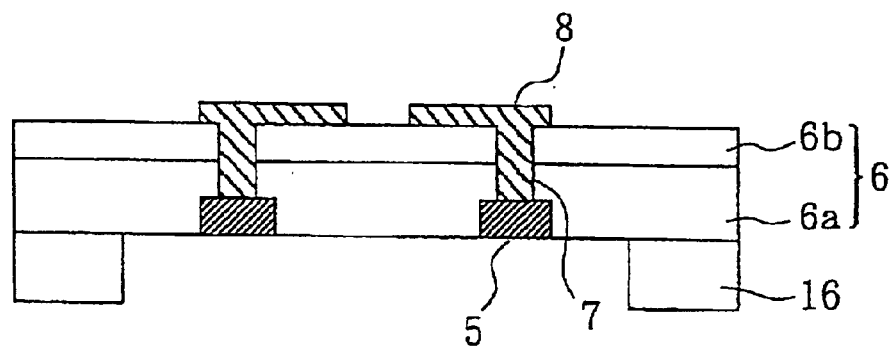
FIG. 5 is a schematic cross-sectional view showing another embodiment of an interconnecting substrate for carrying a semiconductor device according to the present invention.

While the insulating layer in the interconnecting substrate of the present invention can be formed with a single layer made of a single material, it can be also formed to have a layered structure in which layers of two or more different materials are laid, as shown in FIG. 5.

This insulating layer is set to be preferably not less than 10 μm in thickness, viewed from the points of the reliability for loading the semiconductor chip on the interconnecting substrate and the reliability for mounting the interconnecting substrate or the package of the semiconductor device on the external board or such.

Further, as the material for this insulating layer, various insulating resins including epoxy resin; resins produced from the compound having a fluorene-skeleton, both ends of which are acrylate-based; polyimide resin; polybenzoxazole; polybenzocyclobutene; and mixtures of two or more of these resins can be utilized. In particular, it is preferable to have, at least, a single-layered film made of an insulating material (abbreviated appropriately as an "insulating material A", hereinafter) which has a mechanical strength of the film of 70 MPa or greater, an elongation percentage after fracture of 5% or greater, a glass transition temperature of 150° C. or higher and a thermal expansion coefficient of 60 ppm or less, or a single-layered film made of an insulating material (abbreviated appropriately as an "insulating material B", hereinafter) which has an elastic modulus of 10 GPa or greater, a thermal expansion coefficient of 30 ppm or less and a glass transition temperature of 150° C. or higher. These single-layered films are set to be preferably not less than 10 μm in thickness. The values of the mechanical strength of the film and the elongation percentage after fracture, herein, are the measured ones obtained by the tensile test for the insulating materials in accordance with JIS (Japanese Industrial Standard) K 7161 (the tractive characteristic test), while the value of the elastic modulus is the calculated one from the value of the film strength at an amount of distortion of 0.1% which is obtained on the basis of this tensile test results. The value of the thermal expansion coefficient is the measured one by the TAM method in may be favourably employed. Fluorene-based resins have excellent characteristics such as high heat resistance, low dielectric constant, low thermal expansion coefficient and low water absorption and, thus, they are well-suited for the insulating material which is used to produce a minute, high-density interconnecting substrate as disclosed, for example, in Japanese Patent Application Laid-open No. 214141/1997.

As a resin of this sort, there can be given a resin having the following general formula (I), which is produced from a compound having a 9,9-diphenylfluorene-skeleton, both ends of which are acrylate-based.

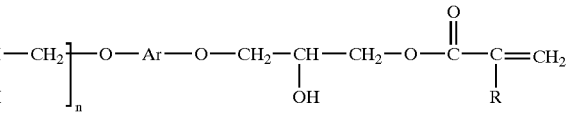

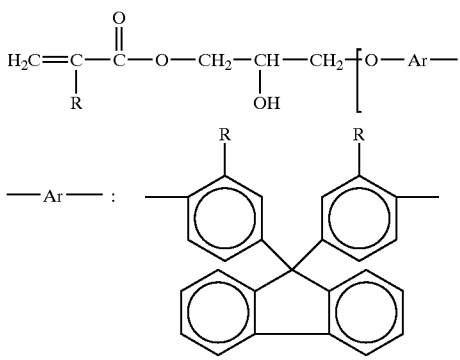

accordance with JIS C 6481, and the value of the glass transition temperature is the measured one by the DMA (Dynamic Mechanical Analysis) method in accordance with JIS C 6481.

For the insulating material A, for example, epoxy resin (MCF-7000LX, made by Hitachi Chemical Co., Ltd.), polyimide resin (AP-6832C, made by Nitto Denko), benzocyclobutene resins (Cyclotene 4000 Series, made by the Dow Chemical Company), polyphenylene ether resins (Xyron®, made by Asahi Kasei Corporation), liquid crystal polymer film (LCP-A, made by Kuraray Co., Ltd.), and fluorocarbon resin impregnating stretched porous thermosetting resin (MICROLAM600, made by Japan Gore Tex Inc.) are well suited.

For the insulating material B, for example, glass cloth impregnating epoxy resin (MCL-E-679, made by Hitachi Chemical Co., Ltd.), aramid non-woven fabric impregnating epoxy resin (EA-541, made by Shin-Kobe Electric Machinery Co., Ltd.), and fluorocarbon resin impregnating stretched porous thermosetting resin (MICROLAM400, made by Japan Gore Tex Inc.) are well suited.

When the insulating layer in the interconnecting substrate of the present invention is made to have a layered structure, a layer made of either the insulating material A or B is preferably comprised therein, and, as the material constituting the remaining layer, resins produced from the compound having a fluorene-skeleton, both ends of which are acrylate-based, (referred to, appropriately, as "fluorene-based resins", hereinafter) can be preferably used. Further, in order to add another prescribed characteristic or improve a certain characteristic, a resin mixture in which another resin is mixed into the main component of a fluorene-based resin can be employed. It is preferable that a resin mixture of this sort contains not less than 80% by weight of fluorene-based resin, and a resin mixture containing, for example, 5%–20% by weight and preferably 5%–10% by weight of epoxy resin In the formula, each of R independently represent a hydrogen atom or a lower alkyl group such as methyl group, ethyl group, n-propyl group and isopropyl group, and n, an integer with a value of 0 to 20.

Through the use of such a resin material as described above for the insulating layer, the interconnecting substrate having an excellent mechanical strength of the film, elongation percentage after fracture as well as a particularly good crack resistance can be obtained, and, thus, a multiple pin semiconductor chip having an area array with pitches as narrow as 100 μm or less can be carried thereon.

When the present inventors conducted the pressure cooker test (at a temperature of 121° C. and a humidity of 100%) for the interconnecting substrates having the insulating layers made of these resins, any peeling-off between resin layers was not observed at all, even after 192 hours.

Further, when the temperature cycling tests (in 1 cycle, the temperature is first set at −65° C. for 30 minutes and then set at 150° C. for 30 minutes) were carried out for the packages of the semiconductor devices shown in FIG. 9(c), in which the insulating layers 6 were made of the following four sorts of resins, respectively, any severance of the interconnections or cracks were not observed therein, even after 1000 cycles.

Resin a: Mechanical strength of film, 78 MPa; Elongation percentage after fracture, 8.5%; Glass transition temperature, 175° C.; Thermal expansion coefficient, 55 ppm; and Elastic modulus, 2.5 Gpa, Resin b: Mechanical strength of film, 180 MPa; Elongation percentage after fracture, 30%; Glass transition temperature, 385° C.; Thermal expansion coefficient, 28 ppm; and Elastic modulus, 6.0 Gpa, Resin c: Glass transition temperature, 180° C.; Thermal expansion coefficient, 11 ppm; and Elastic modulus, 11 Gpa, Resin d: Glass transition temperature, 200° C.; Thermal expansion coefficient, 18 ppm; and Elastic modulus, 12 GPa.

The interconnecting substrate of the present invention may have a multi-layered interconnection structure, in which, on the obverse surface of the insulating layer where the interconnection is set, an insulating layer and an interconnection formed on the obverse surface of the insulating layer are laid one after another in alternate order to form one or more sets of them. As one embodiment of this interconnecting substrate, there is shown, in FIG. 6, an embodiment having a multi-layered interconnection structure wherein another set of an insulating layer and an interconnection are laid on the structure shown in FIG. 1. On the insulating layer 6, an insulating layer 12 is set so as to cover the interconnection 8, and, on this insulating layer 12, an interconnection 13 is set and, then, via conductors are set in the insulating layer 12 so as to make connection between this interconnection 13 and the interconnection 8. In such a multi-layered interconnection structure, at least one layer of the insulating layers is preferably made of the insulating material A or B, and besides, the other insulating layers are preferably made of the afore-mentioned fluorene-based resin.

Figure 7:
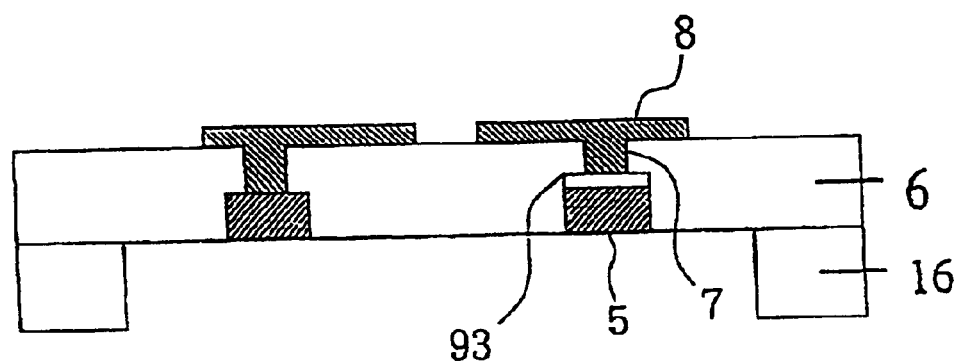
FIG. 7 is a schematic cross-sectional view showing another embodiment of an interconnecting substrate for carrying a semiconductor device according to the present invention.

As the embodiment shown in FIG. 7, by applying a dielectric substance layer 93 each onto the obverse surface of some of electrodes 5 among a plurality of electrodes set on the reverse surface side of the interconnecting substrate, and setting a via conductor 7 on every one of these dielectric substance layers 93, the interconnecting substrate of the present invention may be provided with capacitors, each composed of an electrode 5, a dielectric substance layer 93 and a via conductor 7. Formation of these capacitors can reduce the transmission noise and, thus, facilitates to attain the optimum interconnecting substrate for high-speed operations. Examples of the materials for the dielectric substance layer include titanium oxide ($TiO_2$), tantalum oxide ($Ta_2O_5$), aluminium oxide ($Al_2O_3$), silicon oxide ($SiO_2$), niobium oxide ($Nb_2O_5$) and perovskite-based materials such as BST ($Ba_xSr_{1-x}TiO_3$), PZT ($PbZr_xTi_{1-x}O_3$), PLZT ($Pb_{1-y}La_yZr_xTi_{1-x}O_3$) and $SiBi_2Ta_2O_9$.

The interconnecting substrate of the present invention can take the shape in which the foregoing structure of the interconnecting substrate is each formed on both surfaces of a layered board wherein two pieces of supporting substances 1 are bonded together, as shown in FIGS. 8(a) and (b). With this shape, before or after loading the semiconductor chip(s), two pieces of supporting substrates are separated into two to form two interconnecting substrates or packages of a semiconductor device, and then, as described above, by removing a section of each supporting substrate 1 so as to make the electrodes 5 exposed, each one is made to take the shape suitable for mounting onto another board or the like.

[Package of Semiconductor Device]

The package of a semiconductor device of the present invention may be formed by loading a semiconductor chip on the obverse surface of the interconnecting substrate of the present invention. An electrical connection section of the semiconductor chip such as a pad and an interconnection in the interconnection substrate can be electrically connected by various methods, examples of which include the flip chip method, the wire bonding method and the tape bonding method.

Figure 9:
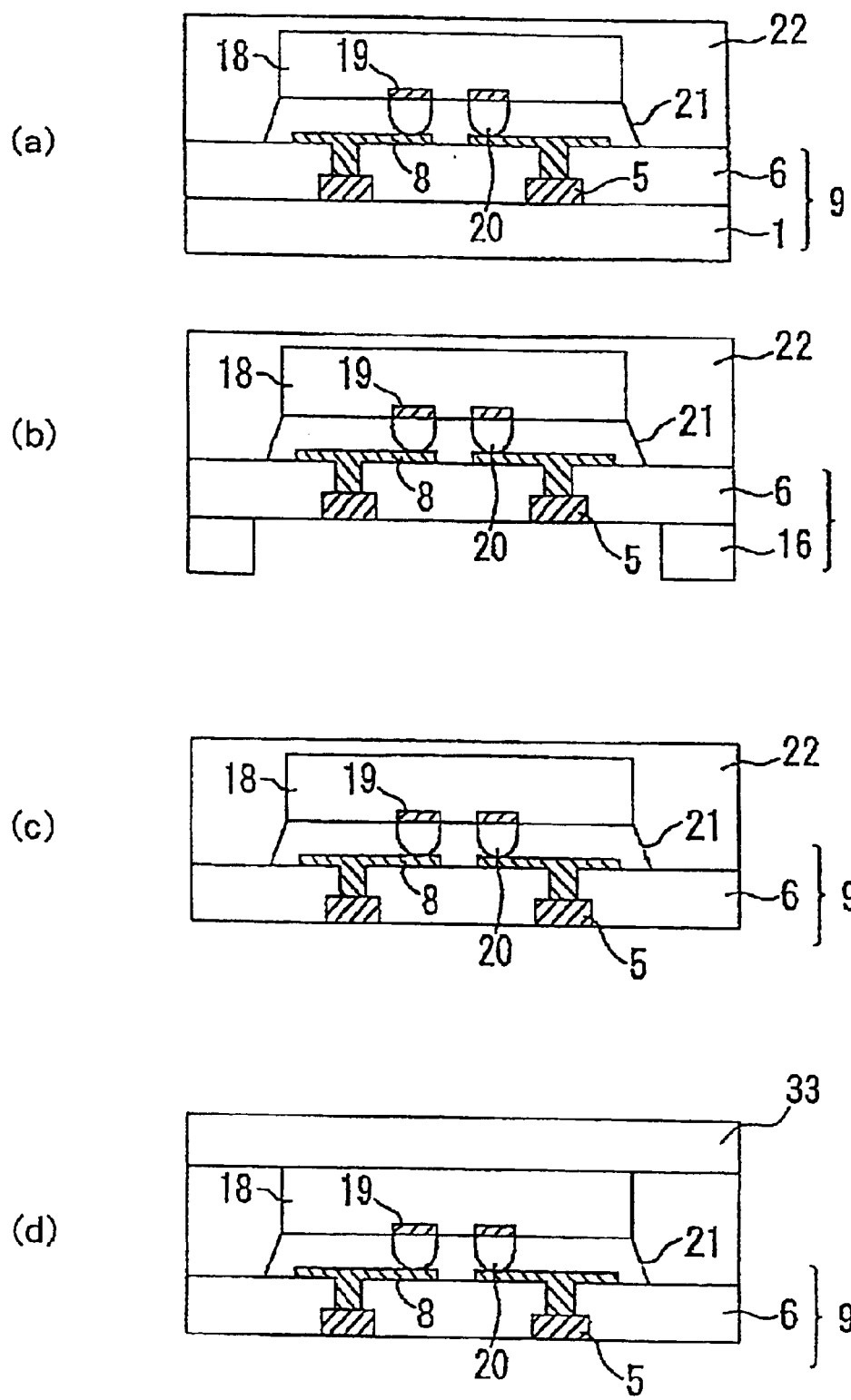
FIG. 9 is schematic cross-sectional views showing embodiments of a package of a semiconductor device according to the present invention.

FIG. 9 shows one embodiment for which the flip chip method is employed. The package of a semiconductor device of the present invention may take the form in which the interconnecting substrate is provided with a substrate 1 lying on the entire reverse surface thereof, as shown in FIG. 9(a). In such a case, when this package is mounted onto another board or such, the substrate is to be removed so as to make the electrode 5 exposed. As the form in which the electrodes are exposed, the substrate 1 may be worked into the shape of a frame, a grid or a mesh, and left on the reverse surface of the insulating layer 6 as a supporting structure 16 to reinforce the package of a semiconductor device, as shown in FIG. 9(b). If a sufficient mechanical strength can be attained without forming such a supporting structure, the whole substrate 1 may be removed to take such a form as shown in FIG. 9(c). When a semiconductor chip is sealed with a molding resin as shown in FIGS. 9(a)–(c), since the molding resin also functions as a supporting structure, a sufficient mechanical strength can be attained without setting another supporting structure 16.

Further, in the package of the semiconductor device of the present invention, as embodiments shown in FIG. 9, the pad 19 set in the semiconductor chip 18 and the interconnection 8 in the interconnecting structure 9 which corresponds to the interconnecting substrate of the present invention can be electrically connected with each other through, for example, a metal bump 20. On that occasion, the gap between the semiconductor chip 18 and the interconnecting structure 9 may be filled up with the underfill resin 21, if circumstances require. Further, the semiconductor chip placed above the interconnection structure 9 may be sealed with the molding resin 22 by the transfer molding method. It is also possible to seal, by another sealing method, the semiconductor chip, as shown in FIG. 9(d), after a heat sink 33 is set on the semiconductor chip 18 to increase thermal radiation.

Figure 10:
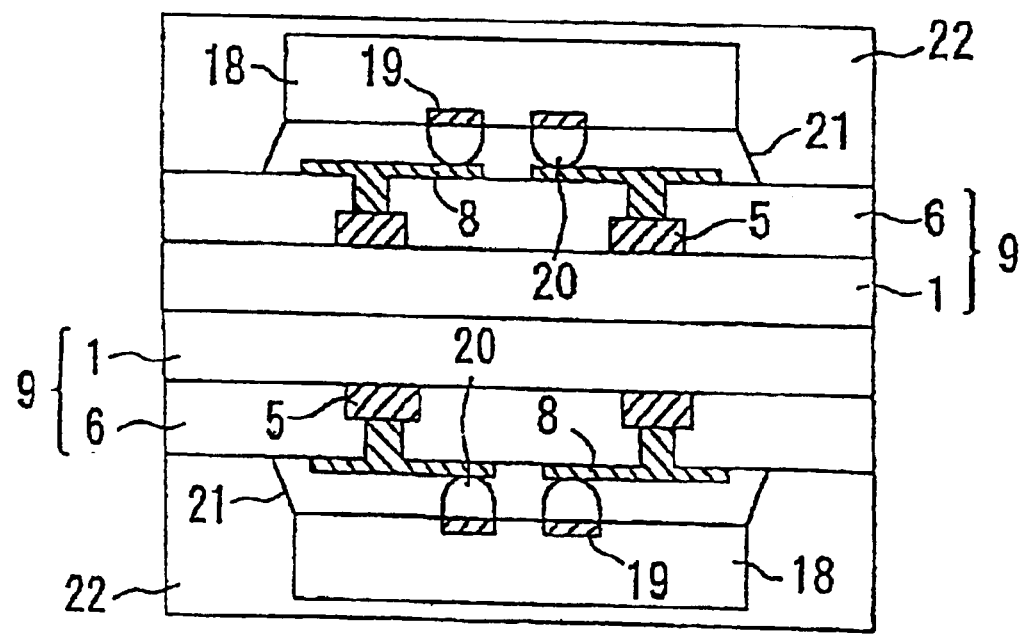
FIG. 10 is a schematic cross-sectional view showing another embodiment of a package of semiconductor devices according to the present invention.

Further, the package of the semiconductor device of the present invention may take the form in which a semiconductor chip is each carried on both surfaces thereof, as shown in FIG. 10. A form of this sort can be attained by loading a semiconductor chip each onto both surfaces of the interconnecting substrate, the form of which has been described with FIG. 8. In mounting this package of semiconductor devices onto another board or the like, the layered substrate wherein two pieces of substrates are bonded together are separated into two to form two packages of a semiconductor device, and then, as described above, by removing each substrate 1 so as to make the electrodes 5 in the interconnecting substrate 9 exposed, each package is made to take the shape suitable for mounting onto another board or the like.

[Producing Method of Interconnecting Substrate and Package of Semiconductor Device]

Figure 11:
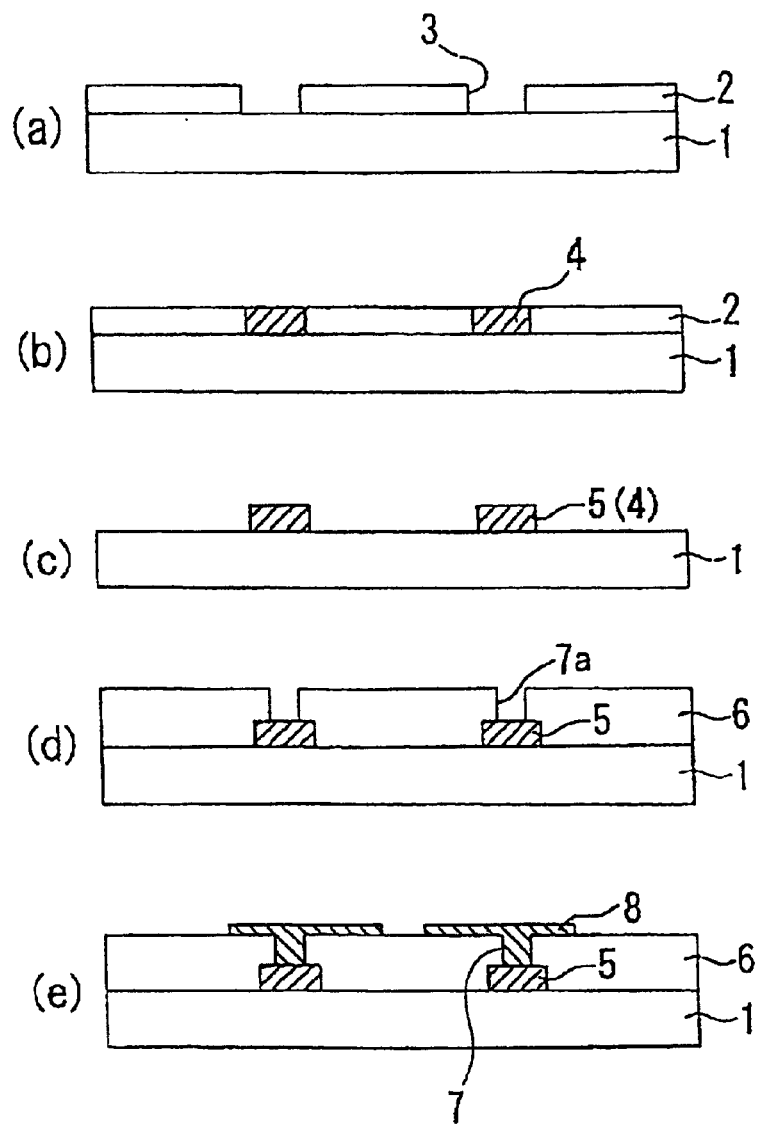
FIG. 11 is a series of cross-sectional views illustrating the steps of one embodiment of a producing method of an interconnecting substrate for carrying a semiconductor device according to the present invention.

FIG. 11 is a series of cross-sectional views illustrating the steps of one embodiment of a producing method according to the present invention.

First, as shown in FIG. 11(a), on a substrate 1 made of a metal board of stainless steel, Cu, a Cu alloy, Al, Ni or such, a resist layer for the electrode pattern formation is formed, and then, by patterning this resist layer, a resist mask 2 which has opening sections 3 corresponding to a prescribed electrode pattern is formed.

Next, as shown in FIG. 11(b), applying an electrical current thereto from the substrate 1, plating layers 4 are formed on the substrate 1 inside of the opening sections 3 by the electrolytic plating method. Following that, as shown in FIG. 11(c), the resist mask 2 is removed so as to leave, on the substrate 1, the plating layers 4 which have a prescribed electrode pattern corresponding to the opening section pattern of the resist mask 2, whereby electrodes 5 are formed. For the formation of the electrodes 5, as described above, it is preferable, from the viewpoint of the reliability, to employ the electrolytic plating method, by which dense metal can be deposited, but it is also possible to deposit the plating layers 4 inside of the opening sections 3 by the electroless plating method to form the electrodes 5.

Next, as shown in FIG. 11(d), an insulating layer 6 is formed on the substrate 1 where the electrodes 5 have been formed, and, in this insulating film 6, via holes 7a are formed to reach respective electrodes 5 by the photolithographic method or the laser processing method.

Examples of the material for the insulating layer 6 include various insulating resins such as epoxy resin, the aforementioned fluorene-based resins, polyimide resin, polybenzoxazole and polybenzocyclobutene. For the sake of improving the mounting reliability, this insulating layer 6 can be, for example, made of a plurality of resin layers, as shown in FIG. 5.

Next, as shown in FIG. 11(e), on the insulating layer 6, a conductive substance layer is formed by the sputtering method, the electroless plating method, the electrolytic plating method or the like, so as to fill up via holes 7a, and this conductive substance layer is patterned by means of photolithography to form an interconnection layer 8. Alternatively, after a conductive substance layer is formed so as to fill up the via holes 7a, the superfluous part of the conductive substance layer lying on the obverse surface of the insulating layer 6 is removed to leave the conductive substance only inside of the via holes 7a and form via conductors 7, and, subsequently, a conductive substance layer to connect with these via conductors is formed, using either the same or a different conductive substance, and by patterning this, an interconnection layer can be formed.

The formation of the interconnecting substrate of the present embodiment is accomplished in the steps described above, but, in order to work this interconnecting substrate further into the form suitable for mounting onto another board or the like, for example, as shown in the foregoing FIG. 1 and FIG. 4, a prescribed region of the substrate 1 is selectively etched, and the electrodes 5 for making electrical connection with the outside are made to be exposed and, at the same time, the substrate left along the periphery of the insulating layer 6 in the form of a frame is made to serve as a supporting structure 16. As described above, in addition to the shape of a frame, the supporting structure 16 can be formed into the shape of a grid or a mesh.

After that, if necessary, as shown in FIG. 3, a solder resist 17 may be formed around the electrodes 5 for loading solder balls on the electrodes 5, and, solder balls 31 may be loaded thereon.

Figure 12:
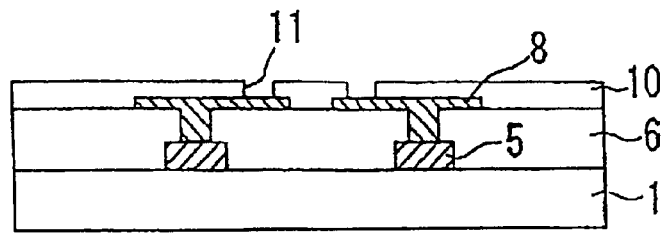
FIG. 12 is a schematic cross-sectional view showing another embodiment of an interconnecting substrate for carrying a semiconductor device according to the present invention.

Further, after the interconnection layer 8 is formed, as shown in FIG. 12, a cover coat 10 may be formed on the insulating layer 6 so as to cover the interconnection layer 8, and, as a pad section 11, an opening may be set at a prescribed position of this cover coat 10 to make connection with the semiconductor chip. In this pad section 11, an electrode pad may be formed by filling up the opening with a conductive substance.

Figure 6:
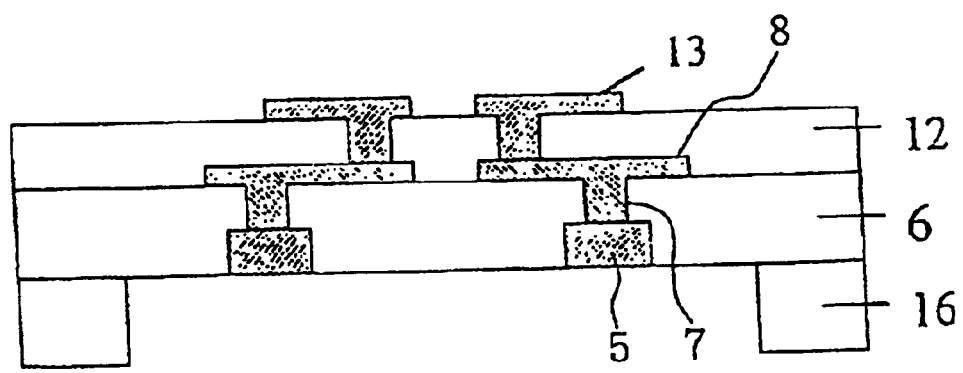
FIG. 6 is a schematic cross-sectional view showing another embodiment of an interconnecting substrate for carrying a semiconductor device according to the present invention.

Further, after the interconnection layer 8 is formed, as shown in FIG. 6, an insulating layer 12 may be formed over the insulating layer 6 so as to cover the interconnection layer 8, and then via conductors in the insulating layer 12 as well as an interconnection layer 13 on the insulating layer 12 may be formed in the same way as described above, which sets a multi-layered interconnection structure. By repeating this step, the structure may have any given number of layers.

With such a producing method of the present embodiment, it is very easy to make the electrodes 5 arrayed with narrower pitches and to form them with a higher accuracy. Further, because the electrodes 5 are structurally buried in the insulating film 6, the stress and the strain imposed on the electrodes 5 are modified and the stress centralization can be reduced so that an interconnecting substrate having excellent reliability for mounting on the external board or apparatus can be produced. If a semiconductor chip is loaded onto the interconnecting substrate of the present embodiment to make a package of a semiconductor device, the reliability for mounting this package of a semiconductor device onto an external board or apparatus can be enhanced.

Further, because the substrate 1 utilized for the formation of the electrodes 5 can be left as the supporting structure 16 for the interconnecting substrate in the step of removal performed to make the electrodes 5 exposed, the separate step of setting a supporting structure is unnecessary and, thus, it is possible to produce an interconnecting substrate with good manageability, excellent reliability for loading the chip and excellent reliability for mounting onto another board or the like by a simple and easy method.

Figure 8:
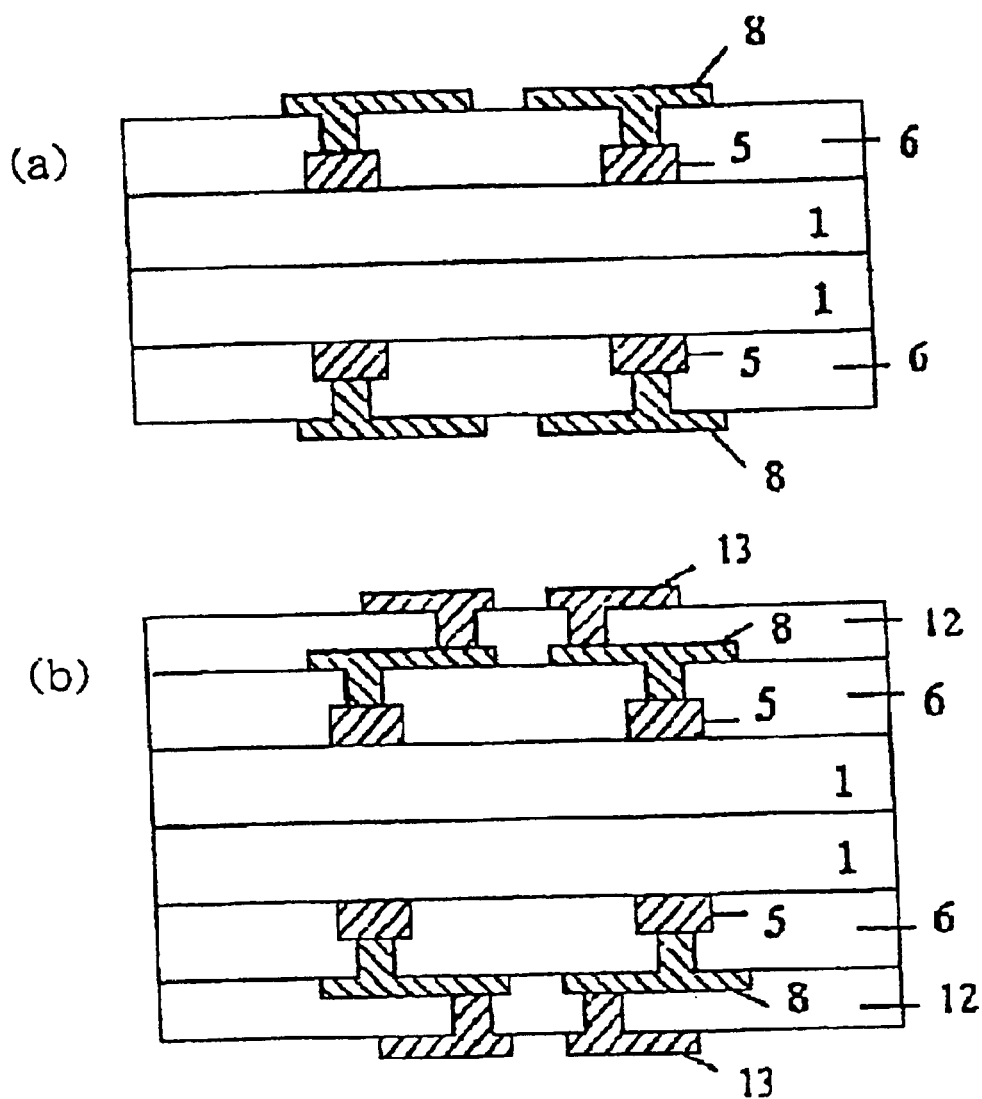
FIG. 8 is schematic cross-sectional views showing other embodiments of an interconnecting substrate for carrying a semiconductor device according to the present invention.

The interconnecting substrate in which an interconnection structure is each formed on both surfaces of the layered board, as shown in FIG. 8, can be produced, for example, as follows.

Figure 13:
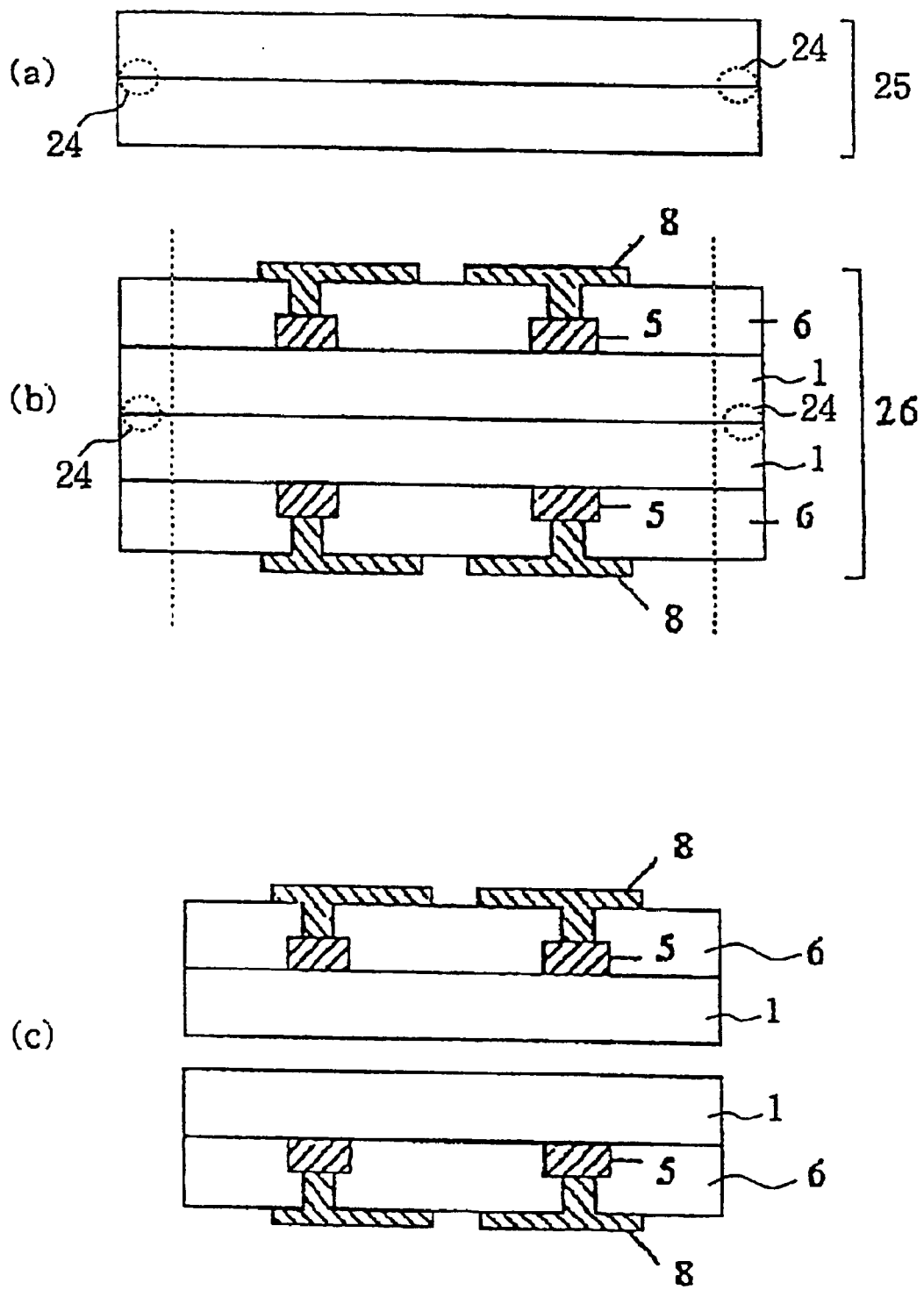
FIG. 13 is a series of cross-sectional views illustrating the steps of another embodiment of a producing method of an interconnecting substrate for carrying a semiconductor device according to the present invention.

Firstly, as shown in FIG. 13(a), a layered board 25 in which a first substrate and a second substrate are bonded together is prepared. For example, heat-resistance adhesive epoxy or polyimide resin is disposed around one of the substrate 1 (adhesive region 24), and the other substrate is adhered thereto to bond together.

Next, in the same way as the foregoing method, a resist layer is each formed on both sides of the layered board, and by patterning these two layers, opening patterns corresponding to a prescribed first and a prescribed second electrode pattern are formed, respectively. Next, applying an electrical current thereto from the substrate 1, plating layers are formed by the electrolytic plating method inside of the opening sections in the resist layers, and, subsequently, by removing the resist layers on both surfaces of the layered board 25, first and second electrodes 5 are formed, respectively. Next, in the same way as the foregoing method, an insulating layer 6 is each formed on both surfaces of the layered board 25 and, then, after respective via holes are formed on these insulating layers, respective conductive films are formed so as to fill up these via holes and, by patterning these, the interconnections 8 are formed (FIG. 13(b)). After that, by severing the interconnecting substrate 26 along the dotted lines shown in FIG. 13(b) (on the inner side of the adhesive regions 24), the first and the second substrates 1 bonded together are separated to provide two interconnecting substrates, as shown in FIG. 13(c). Alternatively, a semiconductor chip is loaded onto, at least, one surface of the interconnecting substrate and, for example, after a semiconductor chip is each loaded onto both surfaces, as shown in FIG. 10, to form a package of semiconductor devices, the first and the second substrates 1 bonded together are separated to provide two packages of a semiconductor device.

Since the producing method of this sort can simplify the steps thereof, the method can improve the productivity and facilitate to attain lower cost production.

[Producing Method of Interconnecting Substrate with Layered Type Electrode]

Figure 14:
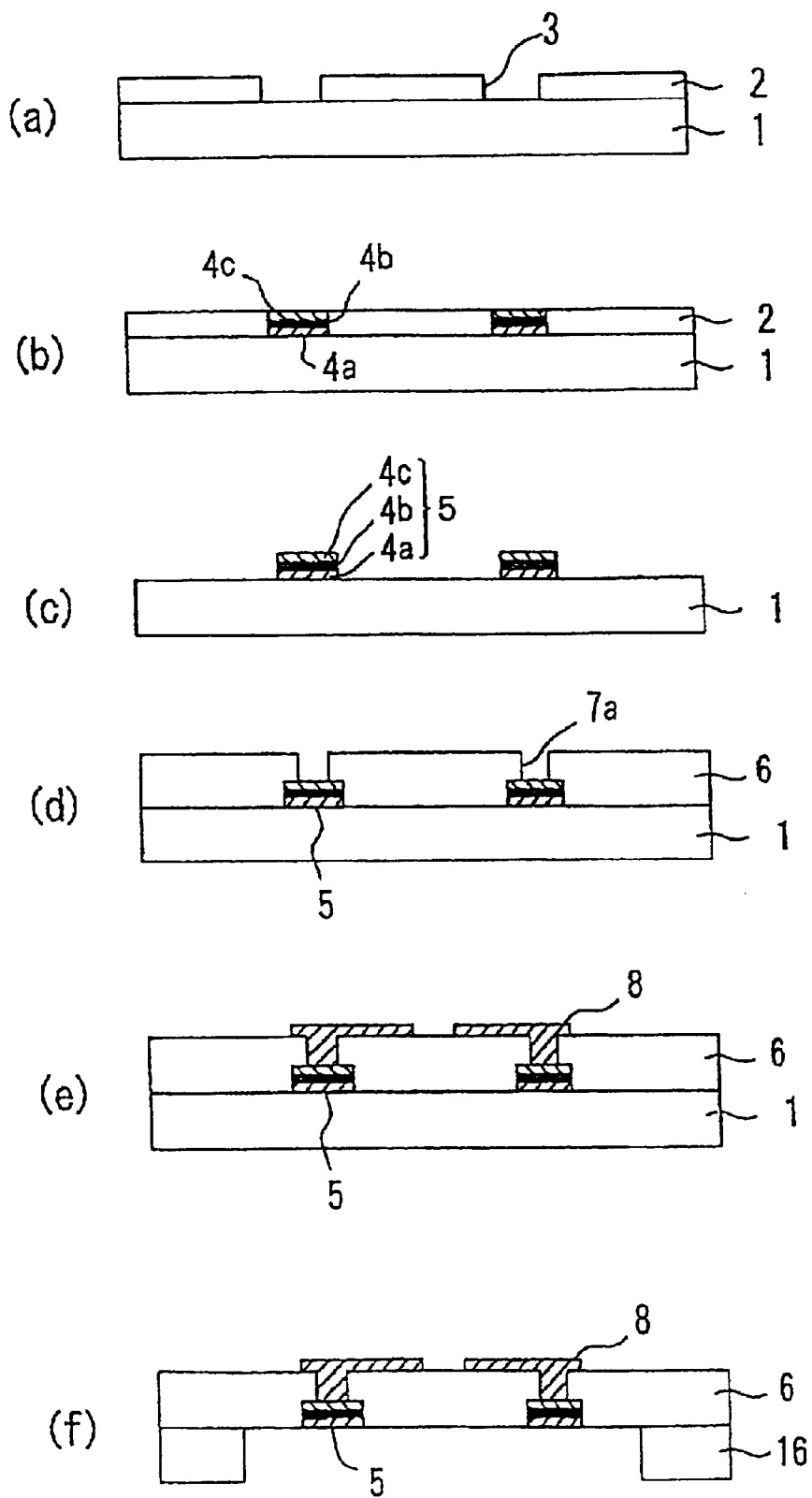
FIG. 14 is a series of cross-sectional views illustrating the steps of another embodiment of a producing method of an interconnecting substrate for carrying a semiconductor device according to the present invention.

FIG. 14 shows one embodiment of a producing method of an interconnecting substrate with layered type electrodes.

In the producing method of the present embodiment, a stainless steel board is utilized as a substrate 1, and there are formed electrodes with a triple-layered structure in which a Au plating layer, a Ni plating layer and a Cu plating layer are laid, in this order, from the reverse surface side of the interconnecting substrate.

Firstly, as shown in FIG. 14(a), on a substrate 1 made of stainless steel (for example, SUS304, made by Nisshin Steel), a resist layer for the plating film formation is formed, and by patterning this resist layer, a resist mask 2 which has opening sections 3 corresponding to a prescribed electrode pattern is formed.

Hereat, the thickness of the substrate 1 is preferably 0.1 mm–1.0 mm and more preferably 0.2 mm–0.8 mm. The reason lies in a fact that if the board thickness is too thin, the warp is liable to happen during the production steps of the interconnecting substrate, which lowers the accuracy in fabrication and makes the formation of minute interconnections difficult, and, on the other hand, if the board thickness is too thick, the weight of the board becomes considerable, which lowers manageability.

Next, as shown in FIG. 14(b), on the substrate 1 inside of the opening sections 3, a Au plating layer 4a, a Ni plating layer 4b and a Cu plating layer 4c are formed, in this order, by either the electrolytic plating method or the electroless plating method. The thicknesses of respective plating layers are preferably 0.3 $\mu$m–3 $\mu$m for the Au plating layer, 1 $\mu$m–7 $\mu$m for the Ni plating layer and not less than 5 $\mu$m for the Cu plating layer.

Next, as shown in FIG. 14(c), the resist mask 2 is removed from the substrate 1, and the plating layers which have a prescribed electrode pattern corresponding to the opening section pattern of the resist mask 2 are left on the substrate 1, and thereby electrodes 5 with a triple-layered structure of Au/Ni/Cu are formed.

Next, as shown in FIG. 14(d), an insulating layer 6 is formed on the substrate 1 where the electrodes 5 are formed, and via holes 7a to reach the electrodes 5 are formed in this insulating layer 6.

Following that, as shown in FIG. 14(e), a conductive substance layer is formed on the insulating layer 6 so as to fill up via holes 7a and then, by patterning this conductive substance layer, an interconnection layer 8 is formed.

Finally, as shown in FIG. 14(f), a prescribed region of the substrate 1 is removed from the reverse surface side thereof by means of etching and therby, along with making the electrodes 5 exposed, a supporting structure 16 is formed.

In the present embodiment having electrodes 5 with a triple-layered structure of Au/Ni/Cu, the peeling-off hardly occurs because the substrate 1 made of stainless steel and the Au plating layer are sufficiently adhesive to each other on their interface. Further, the thermal budget in production including the formation of the insulating layer 6 may make diffusion from the Au plating layer to the substrate 1 or the Ni plating layer difficult. Therefore, the Au plating layer can fulfil its function as a barrier metal satisfactorily at the time of etching of the substrate 1 so that etching conditions can be selected from a wide range of them. As a result, the yield, the productivity and the manageability in production can be improved. Further, when the solder balls are loaded on the electrodes 5 and thereby electrical connection with an external board or apparatus is made, the Ni plating layer serves as a solder-diffusion resisting layer so that the mounting reliability can be improved.

In a producing method of an interconnecting substrate having another layered type electrodes, a Cu board or a Cu alloy board (for example, KFC, made by Kobe Steel, Ltd.) is employed as the substrate 1 and electrodes with a quadruple-layered structure in which a Ni plating layer, a Au plating layer, a Ni plating layer and a Cu plating layer are laid in this order from the reverse surface side of the interconnecting substrate. This structure can be formed in the same way as the foregoing method, except that the substrate 1 and the electrode structure differ.

The thickness of the substrate 1 is, similar to that in the above method, preferably 0.1 mm–1.0 mm and the thicknesses of the respective plating layers, from the side of the substrate 1, are preferably not less than 1 $\mu$m for the Ni plating layer, 0.3 $\mu$m–3 $\mu$m for the Au plating layer, 1 $\mu$m–7 $\mu$m for the Ni plating layer and not less than 5 $\mu$m for the Cu plating layer.

Because the substrate 1 made of Cu or a Cu alloy (referred to appropriately as a "Cu substrate", hereinafter) can be readily etched with a copper chloride-based or an iron chloride-based etchant, this method has an advantage of possibility of further improvement of the productivity.

Further, according to the investigations made by the present inventors, it was found out that because characteristics of the Cu substrate differ from those of the substrate made of stainless steel, if the Au plating layer is formed directly on the Cu substrate, thermal budget during the steps of production of the interconnecting substrate brings about metal diffusion between the Cu substrate and the Au plating layer, and the Au plating cannot function as a barrier metal in etching. Further investigations successfully led to a solution for the problem of metal diffusion, in which a Ni plating layer 52 is laid on the Cu substrate and then other plating layers are formed thereon. Furthermore, because the intermediate layer of Ni layer can function as a solder-diffusion resisting layer, the electrodes 5 with a multi-layered plating structure of Ni/Au/Ni/Cu is found to be the optimum electrodes for the interconnecting substrate.

As another embodiment, Cu/Ag/Cu electrodes can be formed in the same way as the above methods, and, while the substrate for those electrodes are not particularly limited, for example, a Cu substrate or a stainless steel board can be utilized.

[Producing Method of Interconnecting Substrate with Recess Type Electrode Structure]

Figure 15:
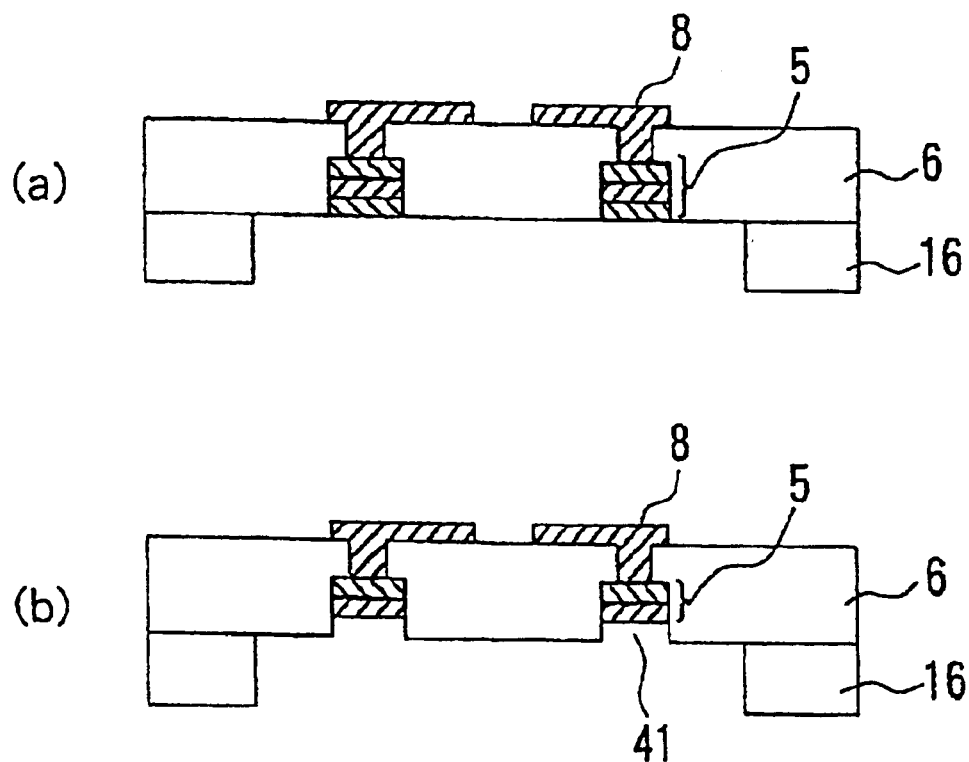
FIG. 15 is a series of cross-sectional views illustrating the steps of another embodiment of a producing method of an interconnecting substrate for carrying a semiconductor device according to the present invention.

The electrode in the interconnecting substrate of the present invention may be, in structure, exposed from the bases of the recess sections 41 which are set on the reverse surface of the insulating layer 6, as shown in FIG. 2(a). This structure can be obtained, for example, as shown in FIG. 15, by removing a portion of each electrode 5 with a prescribed thickness from the reverse surface side of the interconnecting substrate (the insulating layer 6) by means of etching, and thereby forming recess sections 41. When the electrodes have a multi-layered structure made of a plurality of layers of different materials, as shown in FIG. 15, a portion of each electrode with a prescribed thickness can be readily removed by etching with the layer as the unit, taking advantage of the difference in etching rates of different materials. For instance, in the foregoing electrodes 5 with a multi-layered plating structure of Ni/Au/Ni/Cu, sunken structures with respect to the reverse surface of the insulating layer (the reverse surface of the interconnecting substrate) can be formed by removing the only Ni plating layer through etching. Such a structure facilitates loading of solder balls even when the electrodes 5 are arrayed with narrow pitches.

[Producing Method of Interconnecting Substrate with Raised Type Electrode Structure]

The electrodes in the interconnecting substrate of the present invention may be, in structure, protruding from the reverse surface of the insulating layer 6. This structure can be formed, for example, as follows.

Figure 16:
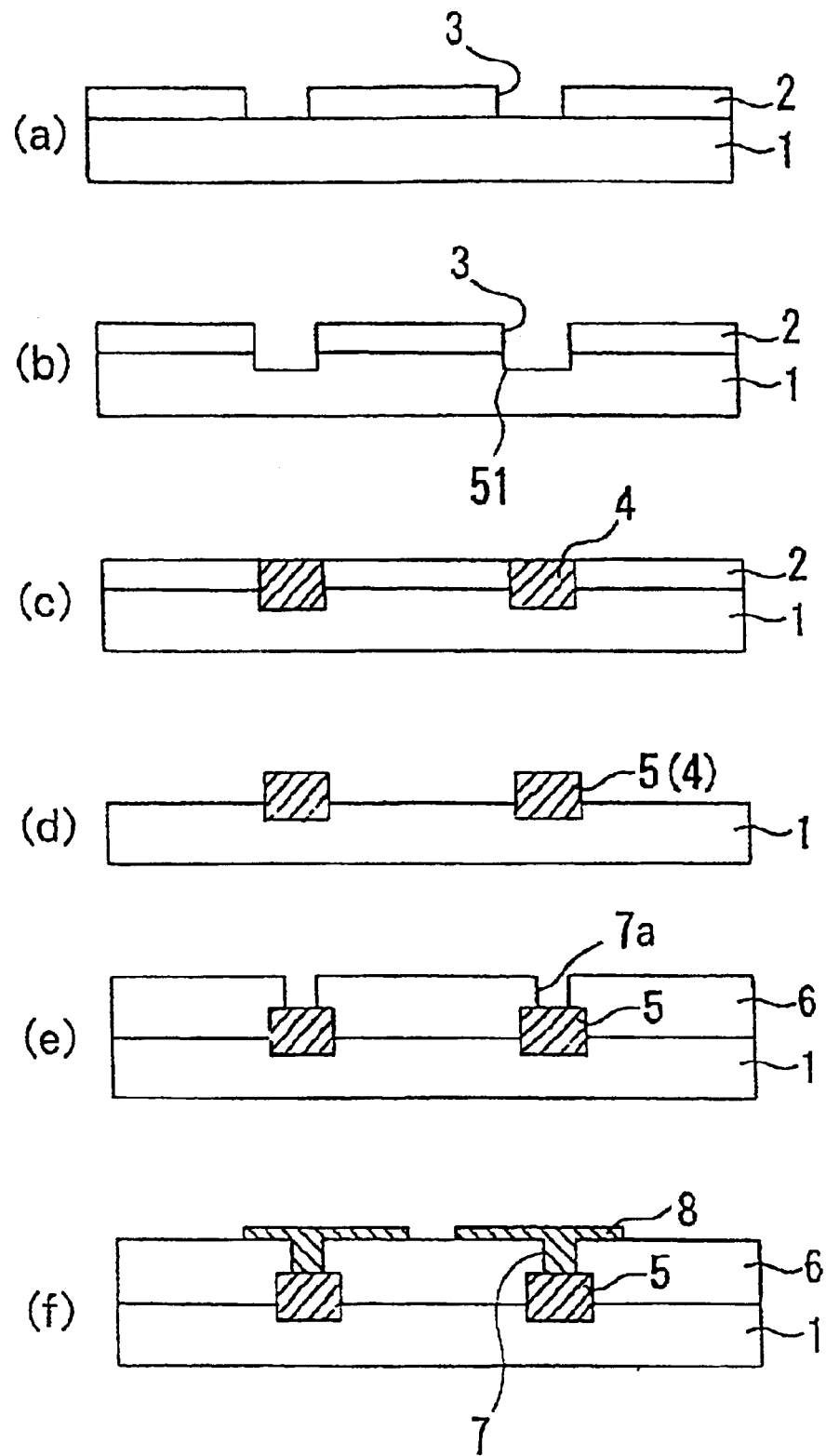
FIG. 16 is a series of cross-sectional views illustrating the steps of another embodiment of a producing method of an interconnecting substrate for carrying a semiconductor device according to the present invention.

First, as shown in FIG. 16(a), on a substrate 1 made of a metal board, a resist layer for the electrode pattern formation is formed, and then, by patterning this resist layer, a resist mask 2 which has opening sections 3 corresponding to a prescribed electrode pattern is formed.

Next, as shown in FIG. 16(b), using the resist mask 2 as an etching mask, etching of the obverse surface of the substrate 1 is carried out, and recess sections 51 corresponding to the opening sections 3 of the resist mask 2 are formed on the obverse surface of the substrate 1.

Next, as shown in FIG. 16(c), the deposition metal is made through the plating method on the exposed section of the substrate 1, and plating layers 4 are formed inside of the recess sections 51 as well as the opening sections 3. Following that, as shown in FIG. 16(d), a resist mask 2 is removed to leave, on the substrate 1, plating layers 4 which have a prescribed electrode pattern corresponding to the opening section pattern of the resist mask 2, and thereby electrodes 5 are formed.

Next, as shown in FIG. 16(e), an insulating layer 6 is formed on the substrate 1 where the electrodes 5 have been formed, and, in this insulating film 6, via holes 7a are formed to reach respective electrodes 5 by the photolithographic method or the laser processing method.

Next, as shown in FIG. 16(f), on the insulating layer 6, a conductive substance layer is formed by the sputtering method, the electroless plating method, the electrolytic plating method or the like, so as to fill up via holes 7a, and this conductive substance layer is patterned by means of photolithography to form an interconnection layer 8.

Subsequently, as shown in FIG. 2(b), a prescribed region of the substrate 1 is selectively etched from the reverse surface side, and the electrodes 5 for making electrical connection with the outside are made to be exposed and, at the same time, the substrate left along the periphery of the insulating layer 6 in the form of e.g. a frame is made to serve as a supporting structure 16.

In this way, the raised type electrodes can be easily formed. Hereat, by regulating the amount of etching in the step shown in FIG. 16(b), the size of the electrodes protruding from the reverse surface of the insulating layer can be well controlled.

[Producing Method of Interconnecting Substrate with Capacitors]

The interconnecting substrate of the present invention may have a composition comprising, e.g. capacitors as shown in FIG. 7, as described above. The structure with capacitors can be formed, for example, as follows.

Figure 17:
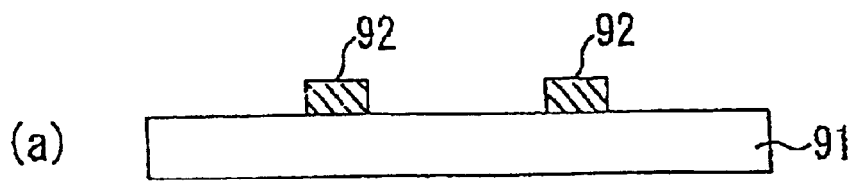
FIG. 17 is a series of cross-sectional views illustrating the steps of another embodiment of a producing method of an interconnecting substrate for carrying a semiconductor device according to the present invention.
Figure 17:
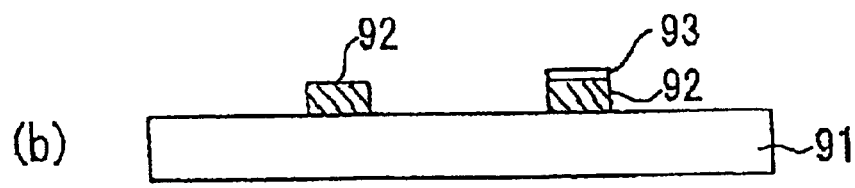
Figure 17:
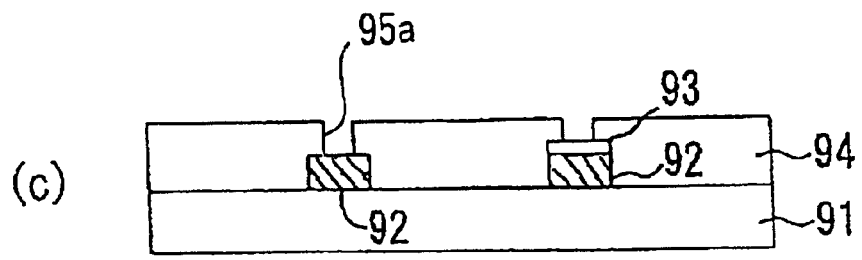
Figure 17:
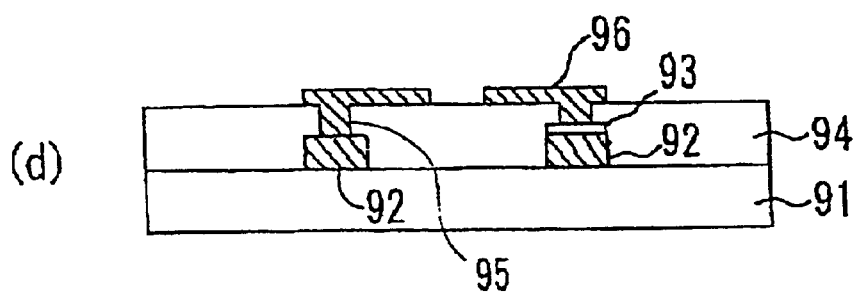
Figure 17:
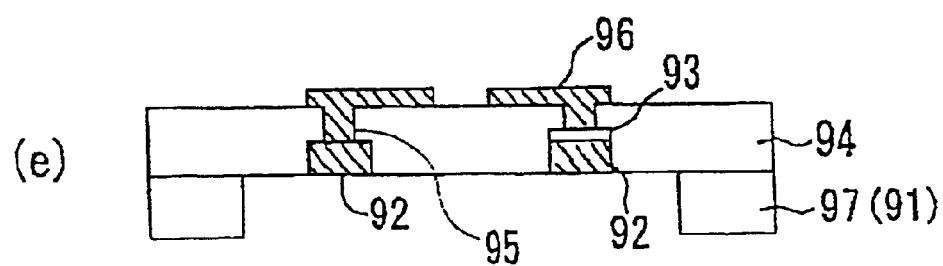
Figure 18:
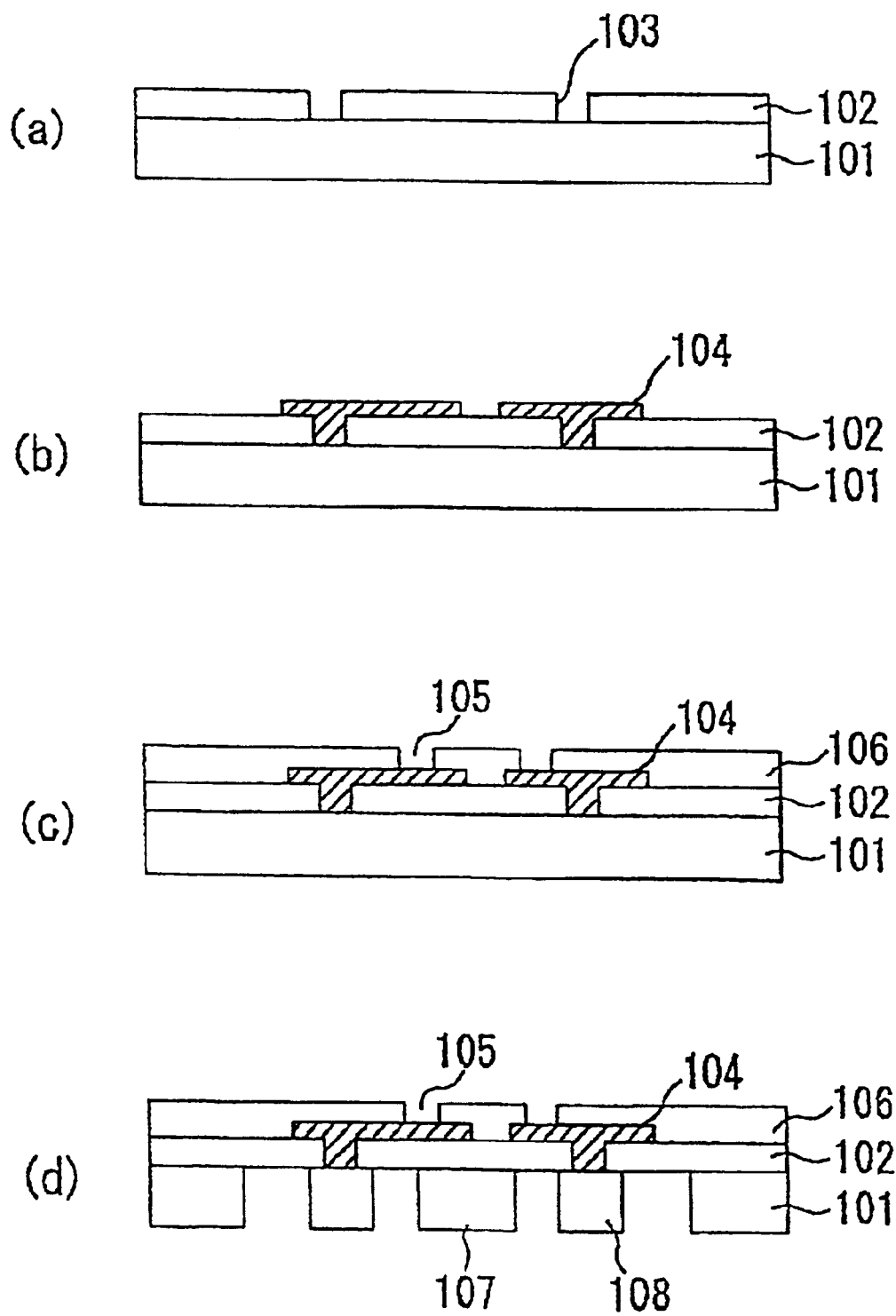
FIG. 18 is a series of cross-sectional views illustrating the steps of a conventional producing method of an interconnecting substrate for carrying a semiconductor device.

Firstly, as shown in FIG. 17(a), electrodes 92 are formed on a substrate 91, following the method utilizing the foregoing plating method.

Next, as shown in FIG. 17(b), on some electrodes among a plurality of electrodes, dielectric substance layers 93 are formed, for example, by the sputtering method, using a metal mask.

Next, as shown in FIG. 17(c), an insulating layer 94 is formed on the substrate 91 where electrodes 92 and dielectric substance layers 93 are formed, and then via holes 95a are formed in this insulating laser 94 by the photolithographic method or the laser processing method.

Next, as shown in FIG. 17(d), a conductive substance layer is formed on the insulating film 94 so as to fill up via holes 95, and by patterning this conductive substance layer, an interconnection layer 96 is formed.

After that, as shown in FIG. 17(e), a prescribed region of the substrate 91 is etched selectively from the reverse surface side, and the electrodes 92 for making electrical connection with the outside are made to be exposed and, at the same time, a supporting structure 97 is formed.

Since the dielectric substance layer 93, the electrode 92 lying under the dielectric substance layer 93 and the via conductive layer 95 lying above the dielectric substance layer 93 function together as a capacitor, the transmission noise can be reduced. Accordingly, the optimum interconnecting substrate for the high-speed operation can be obtained.

What is claimed is:

1. An interconnecting substrate for carrying a semiconductor device, comprising:
    an insulating layer;
    an interconnection set on an obverse surface of said insulating layer;
    an electrode which is set on a reverse surface side of said insulating layer and formed in such a way that, at least, a lateral face of an obverse end of the electrode is all round brought into contact with said insulating layer, while, at least, a reverse surface of the electrode is not in contact with said insulating layer;
    a via conductor which is disposed on an obverse surface of said electrode and formed in said insulating layer so as to connect this electrode with said interconnection; and
    a supporting structure on the surface of said insulating layer.

2. An interconnecting substrate for carrying a semiconductor device according to claim 1, wherein the lateral face of said electrode is all round in contact with said insulating layer, and the reverse surface of said electrode is in one and the same plane with the reverse surface of said insulating layer.

3. An interconnecting substrate for carrying a semiconductor device according to claim 1, wherein said insulating layer has a sunken section on the reverse surface thereof and the reverse surface of said electrode forms a base of said sunken section.

4. An interconnecting substrate for carrying a semiconductor device according to claim 1, wherein a reverse end section of said electrode is protruding from the reverse surface of said insulating layer.

5. An interconnecting substrate for carrying a semiconductor device according to claim 1, wherein said electrode has a layered structure in which a Cu layer is disposed in an obverse end section and, at least, one layer of another conductive substance is disposed on a reverse end side thereof.

6. An interconnecting substrate for carrying a semiconductor device according to claim 1, which has a multi-layered interconnection structure in which, on the obverse surface of said insulating layer where said interconnection is formed, another insulating layer and another interconnection formed on an obverse surface of this insulating layer are laid one after another in alternate order to form one or more sets thereof.

7. An interconnecting substrate for carrying a semiconductor device according to claim 1, comprising an insulating layer made of an insulating material which has a mechanical strength of the film of 70 MPa or greater, an elongation percentage after fracture of 5% or greater, a glass transition temperature of 150° C. or higher and a thermal expansion coefficient of 60 ppm or less.

8. An interconnecting substrate for carrying a semiconductor device according to claim 1, comprising an insulating layer made of an insulating material which has an elastic modulus of 10 GPa or greater, a thermal expansion coefficient of 30 ppm or less and a glass transition temperature of 150° C. or higher.

9. An interconnecting substrate for carrying a semiconductor device according to claim 1, comprising an insulating layer made of a resin produced from a compound having a fluorene-skeleton, both ends of which are acrylate-based.

10. An interconnecting substrate for carrying a semiconductor device according to claim 1, further comprising a capacitor composed of:
an electrode which is set on a reverse surface side of said insulating layer and formed in such a way that, at least, a lateral face of an obverse end of the electrode is all round brought into contact with said insulating layer, while, at least, a reverse surface of the electrode is not in contact with said insulating layer;
a dielectric substance layer laid on an obverse surface of said electrode; and
a conductive substance layer which is laid on an obverse surface of said dielectric substance layer and connected with said interconnection set on the obverse surface of said insulating layer.

11. An interconnecting substrate for carrying a semiconductor device according to claim 1, wherein said supporting structure is set on the reverse surface of said insulating layer so as to allow the reverse surface of said electrode to be exposed.

12. An interconnecting substrate for carrying a semiconductor device according to claim 11, further comprising a solder ball on the reverse surface of said electrode.

13. An interconnecting substrate for carrying a semiconductor device according to claim 1, wherein said supporting structure is set on the entire reverse surface of said insulating layer.

14. An interconnecting substrate for carrying a semiconductor device according to claim 1, wherein said supporting structure is made of a metal.

15. An interconnecting substrate for carrying a semiconductor device, comprising an interconnecting substrate according to claim 1 each set on an obverse surface side and a reverse surface side of a layered board wherein two substrates are bonded together, said substrates each serving as said supporting structure.

16. A package of a semiconductor device, wherein an interconnecting substrate according to claim 1 carries a semiconductor device.

17. A package of a semiconductor device, wherein an interconnecting substrate according to claim 15 carries a semiconductor device, at least, on one side thereof.

18. A package of a semiconductor device according to claim 16, wherein said semiconductor device is sealed with a transfer mold resin.

19. A package of a semiconductor device according to claim 16, wherein a heat sink is set on the semiconductor device.

20. A package of a semiconductor device comprising:
an interconnecting substrate, and
a semiconductor device carried on said interconnecting substrate, wherein
said interconnecting substrate comprising:
an insulating layer;
an interconnection set on an obverse surface of said insulating layer;
an electrode which is set on a reverse surface side of said insulating layer and formed in such a way that, at least, a lateral face of an obverse end of the electrode is all round brought into contact with said insulating layer, while, at least, a reverse surface of the electrode is not in contact with said insulating layer; and
a via conductor which is disposed on an obverse surface of said electrode and formed in said insulating layer so as to connect this electrode with said interconnection.

21. A package of a semiconductor device according to claim 20, wherein the lateral face of said electrode is all round in contact with said insulating layer, and the reverse surface of said electrode is in one and the same plane with the reverse surface of said insulating layer.

22. A package of a semiconductor device according to claim 20, wherein said insulating layer has a sunken section on the reverse surface thereof and the reverse surface of said electrode forms a base of said sunken section.

23. A package of a semiconductor device according to claim 20, wherein a reverse end section of said electrode is protruding from the reverse surface of said insulating layer.

24. A package of a semiconductor device according to claim 20, wherein said electrode has a layered structure in which a Cu layer is disposed in an obverse end section and, at least, one layer of another conductive substance is disposed on a reverse end side thereof.

25. A package of a semiconductor device according to claim 20, which has a multi-layered interconnection structure in which, on the obverse surface of said insulating layer where said interconnection is formed, another insulating layer and another interconnection formed on an obverse surface of this insulating layer are laid one after another in alternate order to form one or more sets thereof.

26. A package of a semiconductor device according to claim 20, comprising an insulating layer made of an insulating material which has a mechanical strength of the film of 70 MPa or greater, an elongation percentage after fracture of 5% or greater, a glass transition temperature of 150° C. or higher and a thermal expansion coefficient of 60 ppm or less.

27. A package of a semiconductor device according to claim 20, comprising an insulating layer made of an insulating material which has an elastic modulus of 10 GPa or greater, a thermal expansion coefficient of 30 ppm or less and a glass transition temperature of 150° C. or higher.

28. A package of a semiconductor device according to claim 20, comprising an insulating layer made of a resin produced from a compound having a fluorene-skeleton, both ends of which are acrylate-based.

29. A package of a semiconductor device according to claim 20, further comprising a capacitor composed of:
an electrode which is set on a reverse surface side of said insulating layer and formed in such a way that, at least, a lateral face of an obverse end of the electrode is all round brought into contact with said insulating layer, while, at least, a reverse surface of the electrode is not in contact with said insulating layer;
a dielectric substance layer laid on an obverse surface of said electrode; and
a conductive substance layer which is laid on an obverse surface of said dielectric substance layer and connected with said interconnection set on the obverse surface of said insulating layer.

30. A package of a semiconductor device according to claim 20, further comprising a solder ball on the reverse surface of said electrode.

31. A package of a semiconductor device comprising:
an interconnecting substrate; and
a semiconductor device carried on said interconnecting substrate,
said interconnecting substrate comprising:
an insulating layer;
an interconnection on an obverse surface of said insulating layer;
an electrode on a reverse surface side of said insulating layer and formed in such a way that at least a lateral face of an obverse end of the electrode is all round brought into contact with said insulating layer while at least a reverse surface of the electrode is not in contact with said insulating layer;

a via conductor on an obverse surface of said electrode and formed in said insulating layer so as to connect said electrode with said interconnection, wherein said semiconductor device is sealed with a transfer mold resin.

32. A package of a semiconductor device according to claim 20, wherein a heat sink is set on the semiconductor device.

33. An interconnecting substrate for carrying a semiconductor device, comprising:

an electrical insulation layer;

an electrically conductive interconnect on one surface of said insulation layer;

an electrode buried in a second surface of said insulation layer opposite said one surface, said electrode having an exposed end that is not covered by said insulation layer, a buried end that is opposite said exposed end and that is buried within said insulation layer, and a peripheral side extending between said exposed and buried ends, said peripheral side being at least partially buried within said insulation layer; and an electrically conductive via in said insulation layer that connects said interconnect to said buried end of said electrode.

34. The substrate of claim 33, wherein said peripheral side of said electrode is entirely buried within said insulation layer and said exposed end of said electrode is flush with said second surf ace of said substrate.

35. The substrate of claim 33, wherein said peripheral side of said electrode is only partially buried within said insulation layer and said exposed end of said electrode extends beyond said second surface of said substrate.

36. The substrate of claim 33, wherein said peripheral side of said electrode is entirely buried within said insulation layer and said exposed end of said electrode is below said second surface of said substrate.

37. The substrate of claim 33, further comprising a supporting frame on a periphery of said second surface of said substrate.

38. The substrate of claim 37, wherein said supporting frame extends around an entirety of the periphery of said second surface of said substrate.

39. The substrate of claim 33, wherein said via has a smaller width than said electrode.

40. An interconnecting substrate for carrying a semiconductor device, comprising an interconnecting substrate according to claim 33, each set on an obverse surface side and a reverse surface side of a layered board wherein two substrates are bonded together, said substrates each serving as said supporting structure.

41. A package of a semiconductor device, wherein an interconnecting substrate according to claim 33 carries a semiconductor device.

42. A package of a semiconductor device, wherein an interconnecting substrate according to claim 40 carries a semiconductor device, at least, on one side thereof.

43. A package of a semiconductor device according to claim 41, wherein said semiconductor device is sealed with a transfer mold resin.

44. A package of a semiconductor device according to claim 41, wherein a heat sink is set on the semiconductor device.

45. The interconnecting substrate for carrying a semiconductor device according to claim 1, wherein the insulating layer is a single layer made of a resin.

46. The interconnecting substrate for carrying a semiconductor device according to claim 33, wherein the insulating layer is a single layer made of a resin.

* * * * *